(12) United States Patent  
Takamiya

(10) Patent No.: US 8,576,329 B2  
(45) Date of Patent: Nov. 5, 2013

(54) FOCUS DETECTION APPARATUS AND CONTROL METHOD THEREFOR

(75) Inventor: Makoto Takamiya, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 271 days.

(21) Appl. No.: 13/126,839

(22) PCT Filed: Nov. 9, 2009

(86) PCT No.: PCT/JP2009/069410  
§ 371 (c)(1),  
(2), (4) Date: Apr. 29, 2011

(87) PCT Pub. No.: WO2010/055931  
PCT Pub. Date: May 20, 2010

(65) Prior Publication Data  
US 2011/0199506 A1    Aug. 18, 2011

(30) Foreign Application Priority Data

Nov. 11, 2008  (JP) ................................. 2008-289171  
Oct. 23, 2009  (JP) ................................. 2009-244890

(51) Int. Cl.  
*H04N 5/225*    (2006.01)

(52) U.S. Cl.  
USPC .......................................... 348/350; 348/349

(58) Field of Classification Search  
USPC .......................................... 348/345, 349, 350  
See application file for complete search history.

(56) References Cited

U.S. PATENT DOCUMENTS

| | | | |
|---|---|---|---|
| 6,597,868 B2 | 7/2003 | Suda | |
| 6,829,008 B1 | 12/2004 | Kondo et al. | |
| 7,474,352 B2 | 1/2009 | Oikawa | |
| 8,243,189 B2 * | 8/2012 | Kusaka | 348/350 |
| 2009/0256952 A1 * | 10/2009 | Kusaka | 348/349 |
| 2011/0102663 A1 * | 5/2011 | Ichimiya | 348/345 |

FOREIGN PATENT DOCUMENTS

| | | | |
|---|---|---|---|
| JP | 01-288810 A | | 11/1989 |
| JP | 10-164413 A | | 6/1998 |
| JP | 11-223761 A | | 8/1999 |
| JP | 2000-156823 A | | 6/2000 |
| JP | 2000-162497 A | | 6/2000 |
| JP | 2001-305415 A | | 10/2001 |
| JP | 2004-191629 A | | 7/2004 |
| JP | 2007-184840 | * | 7/2007 |
| JP | 2007-184840 A | | 7/2007 |
| JP | 2007-323063 A | | 12/2007 |
| JP | 2008-103885 A | | 5/2008 |
| JP | 2008-209761 A | | 9/2008 |
| JP | 2009-063952 A | | 3/2009 |

* cited by examiner

*Primary Examiner* — Tuan Ho  
(74) *Attorney, Agent, or Firm* — Carter, DeLuca, Farrell & Schmidt LLP

(57) ABSTRACT

A focus detection apparatus includes an image sensor including pixels for focus detection for receiving a pair of respective light beams transmitted through different pupil areas of a photographing lens to output a pair of signals; an acquisition unit for acquiring exit window information on the photographing lens; an arithmetic circuit for calculating a tilt for detection area in the detecting position, depending on an image height for a detecting position in which a focus state is detected and on the exit window information; and a calculation unit for calculating the shape of the detection area depending on the calculated tilt, in which the defocus amount is detected on the basis of a phase difference between the pair of signals obtained from pixels for focus detection included in the calculated detection area.

13 Claims, 20 Drawing Sheets

F I G. 5A     F I G. 5B
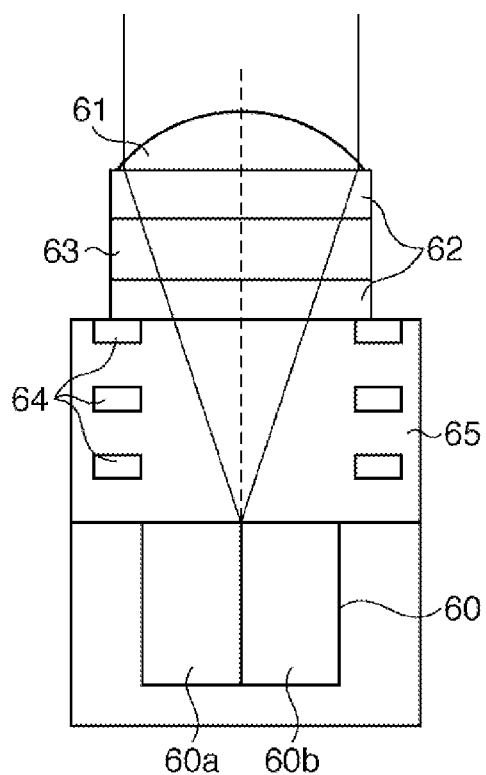
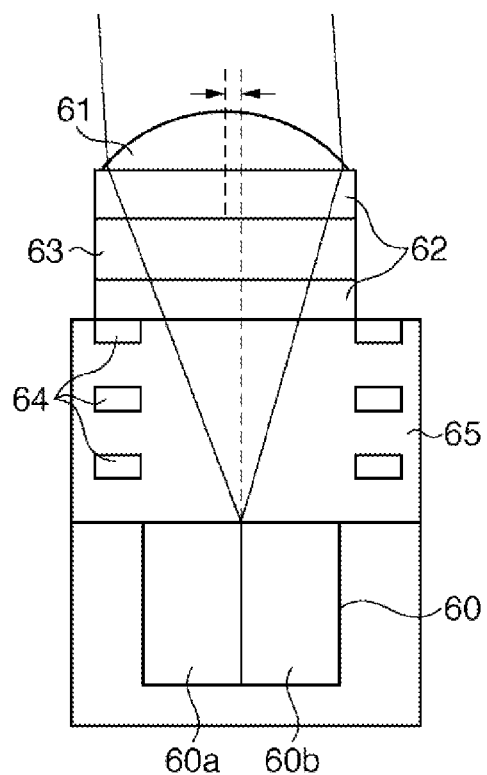

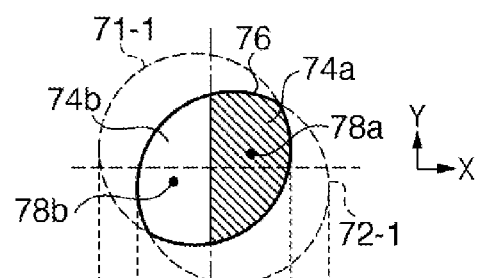
FIG. 9B
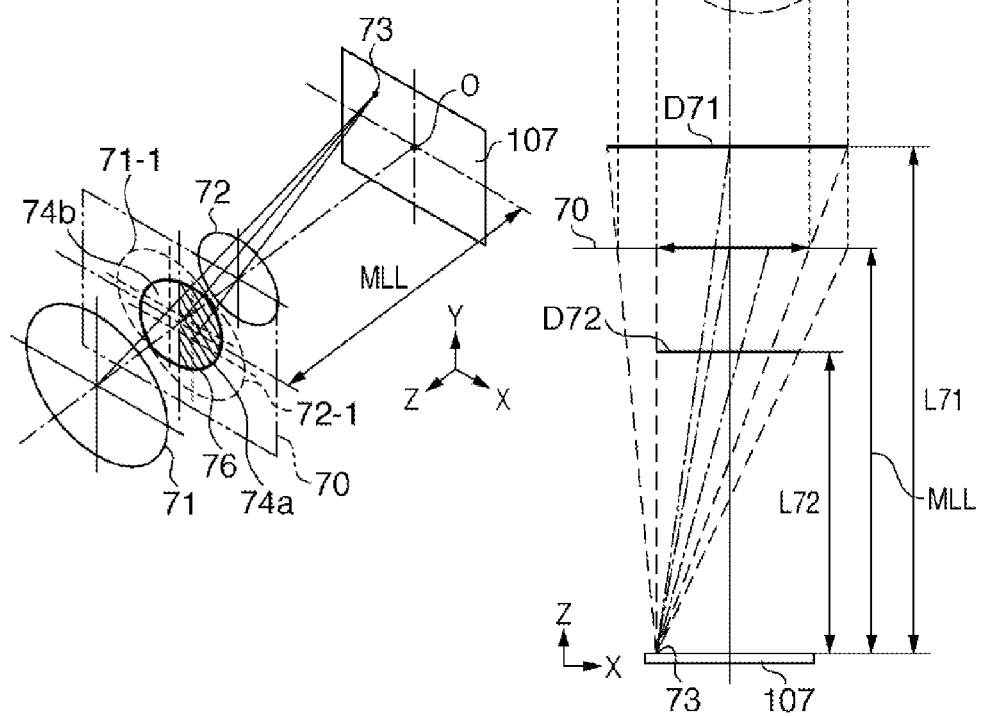
FIG. 9A
FIG. 9C

FIG. 18A
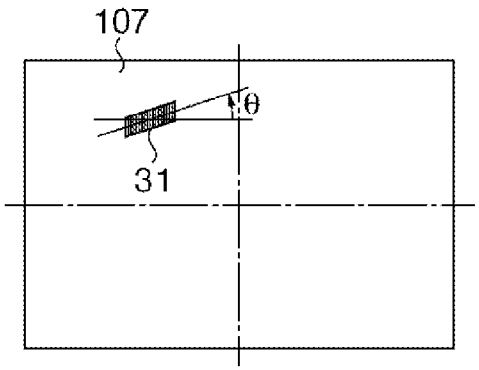
FIG. 18B
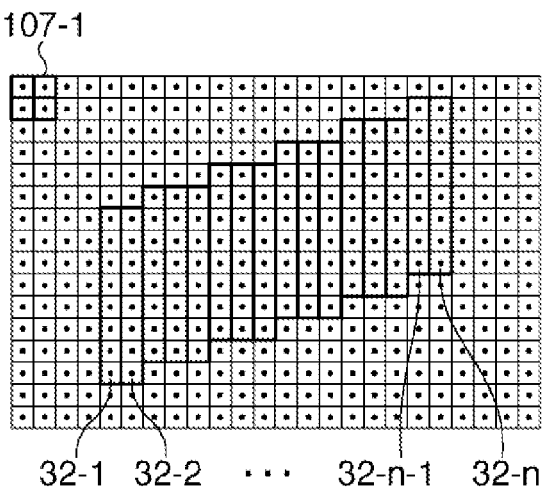
FIG. 18C

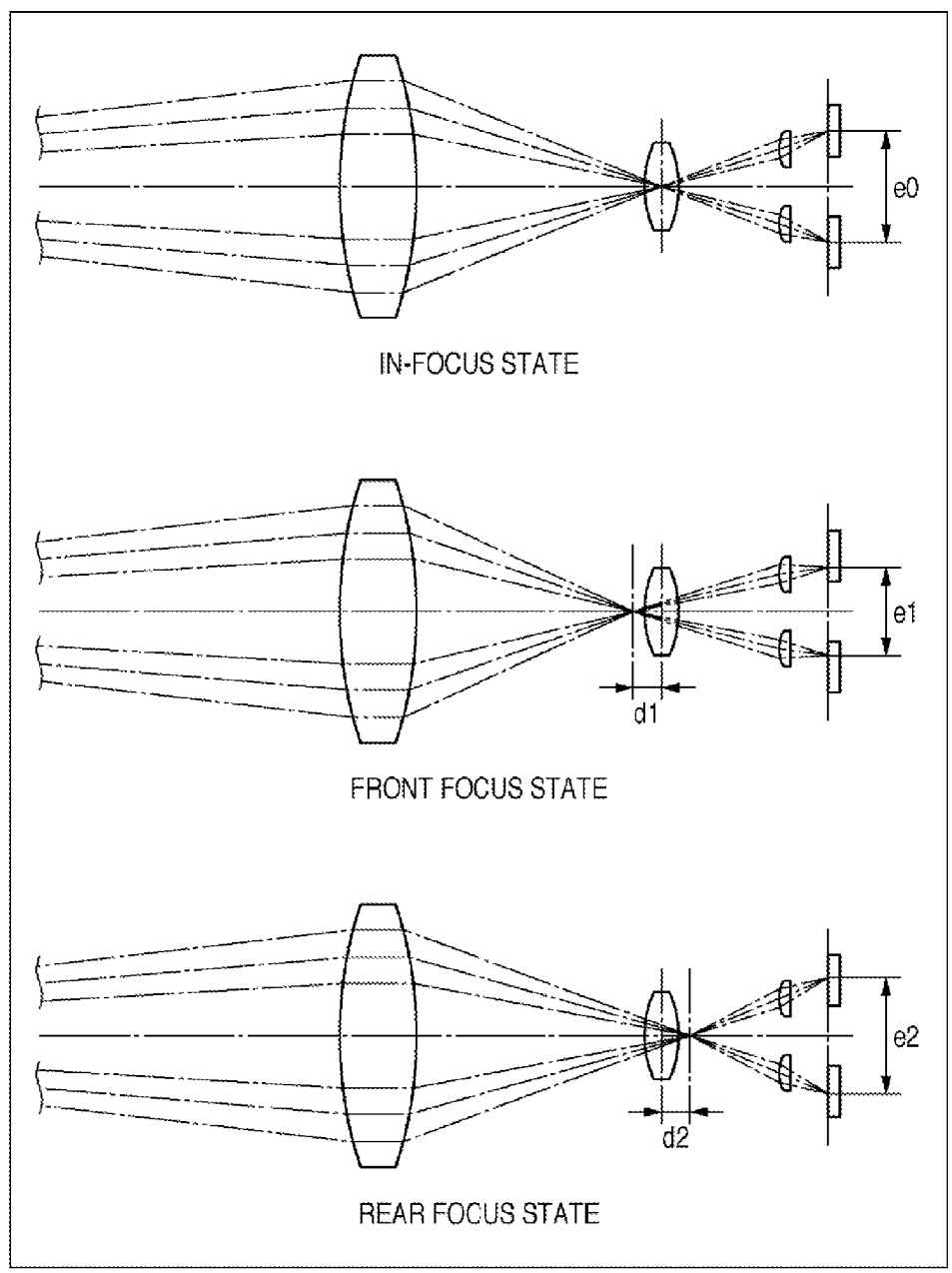

a IMAGE SENSOR b IMAGE SENSOR

FOCUS DETECTION APPARATUS AND CONTROL METHOD THEREFOR

TECHNICAL FIELD

The present invention relates to a focus detection apparatus for detecting a focus state of a photographing lens on the basis of images obtained from a solid-state image sensing device, and a control method for the focus detection apparatus.

BACKGROUND ART

Methods for detecting focus states of photographing lenses include a phase difference detection method (deviation method).

In the phase difference detection method, light beams passing through an exit pupil of a photographing lens are divided in two, and the light beams divided in two are respectively received by a pair of sensors for focus detection. Then, the movement of the photographing lens required for focusing is obtained directly by detecting the deviations of output signals obtained in response to the amount of light received, that is, the deviations between the relative positions of the light beams in the dividing direction thereof. Thus, with one operation for accumulation carried out through the sensors for focus detection, the defocus amount and direction thereof are obtained, thereby allowing high-speed focusing operation. The following patent documents disclose techniques for providing a phase difference detecting function to an image sensor to eliminate the need for dedicated sensors for focus detection and achieve high-speed phase difference AF.

For example, Japanese Patent Laid-Open No. 2000-156823 discloses some light receiving elements (pixels) of an image sensor, in which a sensitivity area of a light receiving portion is located at a position shifted with respect to the optical axis of an on-chip microlens to provide a pupil divide function. Then, these pixels as pixels for focus detection are arranged at a predetermined interval between pixels for image sensing in which a sensitivity area of a light receiving portion is not located at a position shifted, to carry out phase difference focus detection. Furthermore, since the pixels arranged as pixels for focus detection are missing pixels for image sensing, image information for the pixels for focus detection is interpolated with the use of information obtained from peripheral pixels for image sensing.

Furthermore, Japanese Patent Laid-Open No. 2001-305415 describes light receiving portions in some pixels of an image sensor divided in two to provide a pupil divide function, and discloses a technique in which the outputs from the light receiving portions divided in two are individually processed to carry out phase difference focus detection, in which the outputs from the light receiving portions divided in two are added for use as image signals.

Moreover, Japanese Patent Laid-Open No. 2004-191629 discloses a technique for correcting the imbalance in the amount of light between first and second images, which is caused by vignetting of a photographing optical system when an image height is increased, in a technique for an image sensor provided with a phase difference detection function.

In Japanese Patent Laid-Open No. 2004-191629 described above, it is an object to correct the imbalance in the amount of light between first and second images, which is caused by vignetting.

On the other hand, problems caused by vignetting include not only the imbalance in the amount of light between first and second images, but also the movement of an image at a tilt due to a defocus state of first and second images with vignetting at a diagonal image height of an image sensor. In such a case, distance measuring errors may be caused depending on the subject.

The present invention has been conceived in light of the problems of the conventional art described above, and reduces detection errors caused by vignetting in a case in which an image sensor with a phase difference detecting function derived from pupil division in a pixel is used to carry out focusing.

DISCLOSURE OF INVENTION

According to one aspect of the present invention, there is provided a focus detection apparatus for setting a focus detection area corresponding to a selected focus state detecting position, and detecting a defocus amount in the focus detection area on the basis of a phase difference between two images corresponding to the focus detection area, the focus detection apparatus comprising: an image sensor comprising a plurality of pixels for focus detection for receiving a pair of respective light beams transmitted through different pupil areas of a photographing lens, wherein a pair of image signals are output from the plurality of pixels for focus detection; a determination unit for determining a tilt of the focus detection area, depending on positional information on the focus state detecting position with respect to an angle of image sensing view and exit window information on the photographing lens; and a detection unit for detecting the defocus amount on the basis of a phase difference between a pair of images obtained from pixels for focus detection corresponding to the detection area with a tilt determined by the determination unit, from among the plurality of pixels for focus detection.

According to another aspect of the present invention, there is provided a focus detection apparatus for setting a focus detection area corresponding to a selected focus state detecting position, and detecting a defocus amount in the focus detection area on the basis of a phase difference between two images corresponding to the focus detection area, the focus detection apparatus comprising: an image sensor comprising a plurality of pixels for focus detection for receiving a pair of respective light beams transmitted through different pupil areas of a photographing lens, wherein a pair of image signals are output from the plurality of pixels for focus detection; and a selection unit for selecting one focus detection area from a plurality of focus detection areas set in advance, wherein the plurality of focus detection areas have different tilts, depending on image heights of respective fqcus detection areas; and a detection unit for detecting the defocus amount on the basis of a phase difference between the pair of signals obtained from pixels for focus detection corresponding to the selected focus detection area.

According to still another aspect of the present invention, there is provided a focus detection apparatus for detecting a defocus amount for use in focusing, on the basis of a pair of signals with a phase difference, obtained from a detection area comprising a plurality of pixels for detecting a defocus amount, the focus detection apparatus comprising: an image sensor comprising pixels for focus detection for receiving a pair of respective light beams transmitted through different pupil areas of a photographing lens to output a pair of signals; a determination unit for determining the detection area, in response to a direction of image deviation of a pair of images from the pair of light beams; and a detection unit for detecting the defocus amount on the basis of a phase difference between the pair of signals obtained from pixels for focus detection included in the detection area determined by the determination unit.

According to yet another aspect of the present invention, there is provided a control method for a focus detection unit for setting a focus detection area corresponding to a selected focus state detecting position, and detecting a defocus amount in the focus detection area on the basis of a phase difference between two images corresponding to the focus detection area, the control method comprising: a reading step of reading out a pair of image signals, from an image sensor comprising a plurality of pixels for focus detection for receiving a pair of respective light beams transmitted through different pupil areas of a photographing lens, wherein the pair of image signals are output from the plurality of pixels for focus detection; a determination step of determining a tilt of the focus detection area, depending on positional information on the focus state detecting position with respect to an angle of image sensing view and exit window information on the photographing lens; and a detection step of detecting the defocus amount on the basis of a phase difference between a pair of images obtained from pixels for focus detection corresponding to the focus detection area with a tilt determined in the determination step, from among the plurality of pixels for focus detection.

According to still yet another aspect of the present invention, there is provided a control method for a focus detection unit for setting a focus detection area corresponding to a selected focus state detecting position, and detecting a defocus amount in the focus detection area on the basis of a phase difference between two images corresponding to the focus detection area, the control method comprising: a reading step of reading out a pair of image signals, from an image sensor comprising a plurality of pixels for focus detection for receiving a pair of respective light beams transmitted through different pupil areas of a photographing lens, wherein the pair of image signals are output from the plurality of pixels for focus detection; and a selection step of selecting one focus detection area from a plurality of focus detection areas set in advance, wherein the plurality of focus detection areas have different tilts, depending on image heights of each focus detection area; and a detection step of detecting the defocus amount on the basis of a phase difference between the pair of images obtained from pixels for focus detection included in the focus detection area selected in the selection step.

According to yet still another aspect of the present invention, there is provided a control method for a focus detection unit for setting a focus detection area corresponding to a selected focus state detecting position, and detecting a defocus amount in the focus detection area on the basis of a phase difference between two images corresponding to the focus detection area, the control method comprising: a reading step of reading out a pair of image signals, from an image sensor comprising a plurality of pixels for focus detection for receiving a pair of respective light beams transmitted through different pupil areas of a photographing lens, wherein the pair of image signals are output from the plurality of pixels for focus detection; a determination step of detecting the detection area in response to a direction of image deviation of a pair of images from the pair of light beams; and a detection step of detecting the defocus amount on the basis of a phase difference between the pair of signals obtained from pixels for focus detection included in the detection area determined in the determination step.

Further features of the present invention will become apparent from the following description of exemplary embodiments with reference to the attached drawings.

BRIEF DESCRIPTION OF DRAWINGS

FIGS. 5A and 5B are diagrams illustrating the configurations of image sensor pixels which have a pupil divide function;

FIGS. 9A to 9C are perspective views for explaining the shape of vignetting and the barycenter of a light-receiving area;

FIGS. 18A to 18C are diagrams for explaining a focus detection area on an image sensor;

FIG. 19 is a diagram for showing a secondary imaging optical system for focus detection which has been conventionally used in single-lens reflex cameras.

BEST MODE FOR CARRYING OUT THE INVENTION (First Embodiment)

Figure 1:
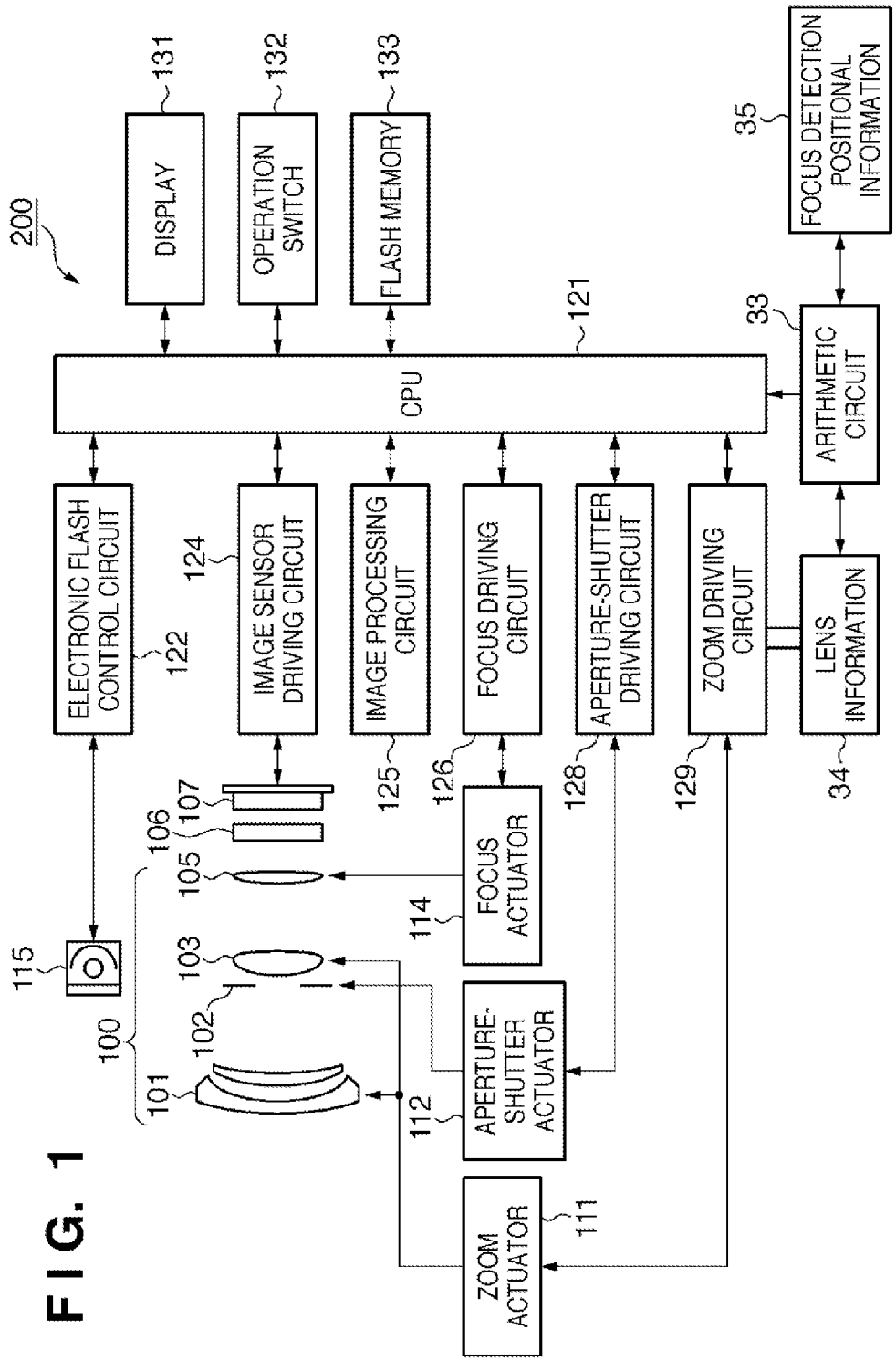
FIG. 1 is a block diagram illustrating a schematic configuration of a camera.

FIG. 1 is a block diagram illustrating the configuration of a camera as an example of an optical instrument in the present embodiment.

In FIG. 1, reference numeral 200 denotes a camera, which is shown as an electronic camera including a camera main body with an image sensor, combined with a photographing lens 100. Reference numeral 101 denotes a first group of lenses disposed at the end of the photographing lens 100, which is held movably in either direction of the optical axis. Reference numeral 102 denotes an aperture-shutter, which both regulates the amount of light for shooting by adjusting its opening diameter and serves as a shutter for adjusting the period of exposure in still image shooting. Reference numeral 103 denotes a second group of lenses. The aperture-shutter 102 and the second group of lenses 103 move together in either direction of the optical axis, and work in conjunction with the first group of lenses 101 moving in either direction to achieve zooming (zoom function).

Reference numeral 105 denotes a third group of lenses, which move in either direction of the optical axis to carry out focusing. Reference numeral 106 denotes an optical low-pass filter, which is an optical element for reducing false colors or moire of shot images. Reference numeral 107 denotes an image sensor composed of a CMOS sensor and peripheral circuitry thereof. In the image sensor 107, two photoelectric conversion elements (light receiving areas) are disposed in each of the light receiving pixels, m pixels and n pixels respectively arranged horizontally and vertically, as will be described later.

Reference numeral 111 denotes a zoom actuator, which turns a cam barrel, not shown, to move the first group of lenses 101 and the second group of lenses 103 in either direction of the optical axis, thereby carrying out zooming. Reference numeral 112 denotes an aperture-shutter actuator, which both controls the opening diameter of the aperture-shutter 102 to regulate the amount of light for shooting and controls the period of exposure in still image shooting. Reference numeral 114 denotes a focus actuator, which moves the third group of lenses 105 in either direction of the optical axis to carry out focusing.

Reference numeral 115 denotes an electronic flash for illuminating a subject, which is preferably a flash unit using a xenon tube, but an illuminating unit provided with an LED that emits light continuously may be used as the electronic flash.

Reference numeral 121 denotes a CPU in the camera for exercising a variety of controls over the camera main body, which has an arithmetic unit, a ROM, a RAM, an A/D converter, a D/A converter, a communication interface circuit, and the like. On the basis of a predetermined program stored in the ROM, the CPU 121 drives various circuits of the camera main body, and executes a series of operations such as AF, shooting, image processing, recording, and the like.

In the present embodiment, the camera 200 further has an arithmetic circuit 33 which calculates a clipping angle on the basis of lens information 34 and focus detection positional information 35. It should be noted that a separate microcomputer may be mounted as this arithmetic circuit 33 or the arithmetic circuit 33 may be built into the CPU 121.

Reference numeral 122 denotes an electronic flash control circuit, which controls lighting of the flash 115 in synchronization with shooting operation. Reference numeral 124 denotes an image sensor driving circuit, which controls image sensing operation of the image sensor 107, applies A/D conversion to acquired image signals and transmits the converted image signals to the CPU 121. Reference numeral 125 denotes an image processing circuit, which applies processing such as γ conversion, color interpolation, or JPEG compression to images acquired by the image sensor 107.

Reference numeral 126 denotes a focus driving circuit, which drives and controls the focus actuator 114 on the basis of a focus detection result and drives the third group of lenses 105 in either direction of the optical axis to exercise focus control. Reference numeral 128 denotes an aperture-shutter driving circuit, which drives and controls the aperture-shutter actuator 112 to control the opening of the aperture-shutter 102. Reference numeral 129 denotes a zoom driving circuit, which drives the zoom actuator 111 depending on zooming operation carried out by the photographer.

Reference numeral 131 denotes a display such as an LCD, which displays information regarding a shooting mode of the camera, a preview image before shooting and an image for confirmation after shooting, an in-focus state indication image in focus detection and the like. Reference numeral 132 denotes a group of operation switches, which is composed of a power switch, a release (shooting trigger) switch, a zooming switch, a shooting mode selection switch, etc. Reference numeral 133 denotes a removable flash memory, which records shot images.

Figure 2:
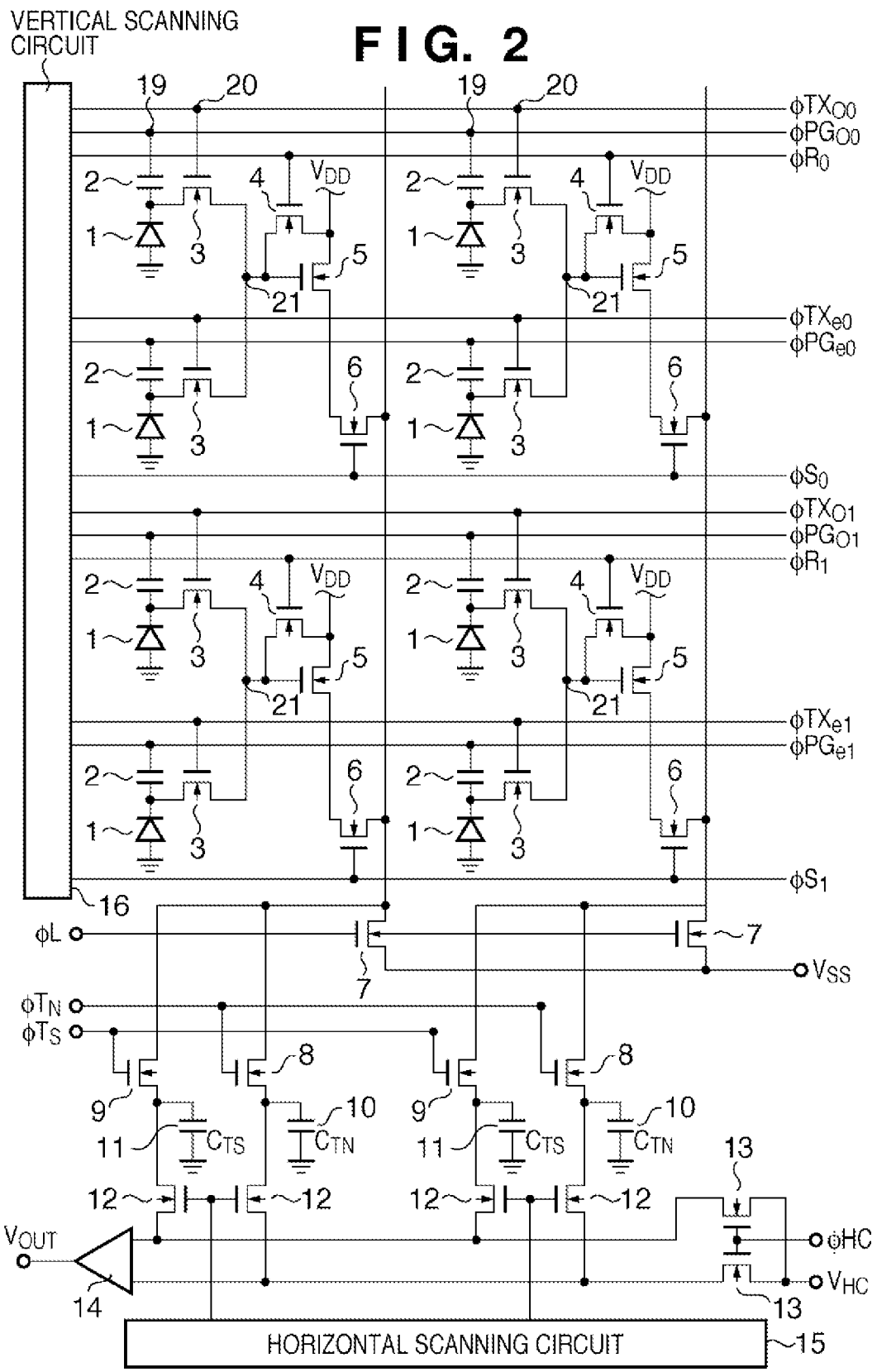
FIG. 2 is a circuit diagram illustrating a configuration example of an image sensor.
Figure 3:
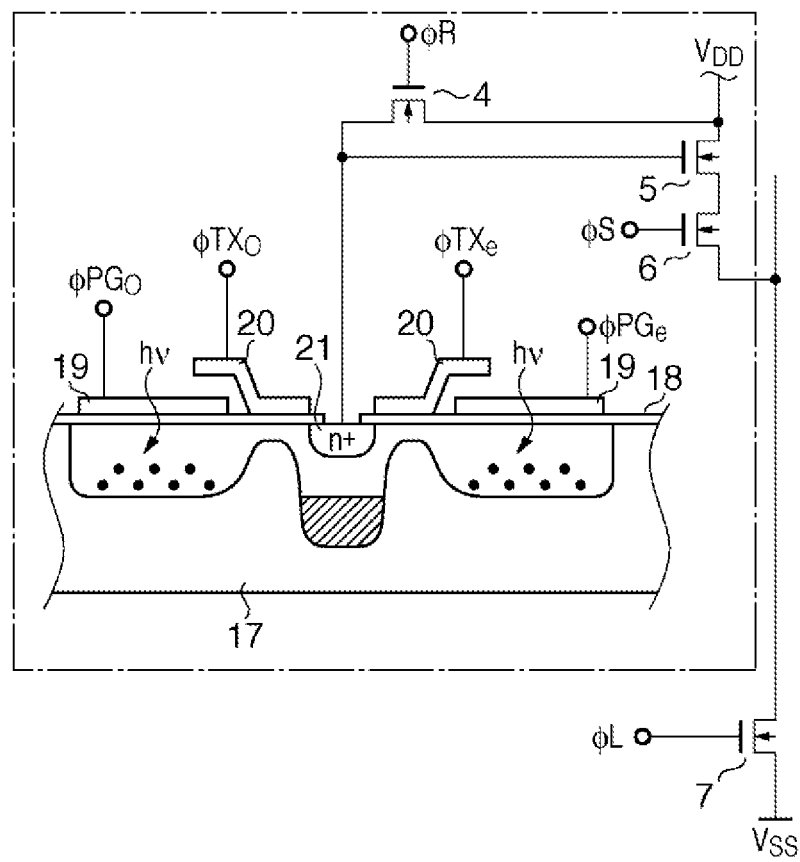
FIG. 3 is a circuit diagram of wiring for two photoelectric conversion elements of an image sensor.

FIG. 2 is a circuit diagram illustrating a schematic configuration of the image sensor 107 in the present embodiment. The diagram shows a range of a photoelectric conversion unit of a two-dimensional CMOS area sensor for 2 columns×4 rows. However, since each pixel has two photoelectric conversion elements provided in the horizontal direction in the present embodiment as described below, it is found that a circuit configuration for 1 column×4 rows pixels is shown in the figure. In FIG. 2, reference numeral 1 denotes a photoelectric conversion unit of the photoelectric conversion element, which is composed of a MOS transistor gate and a depletion layer below the gate, reference numeral 2 denotes a photogate, reference numeral 3 denotes a transfer switch MOS transistor, and reference 4 denotes a reset MOS transistor. Reference numeral 5 denotes a source follower amplifier MOS transistor, reference numeral 6 denotes a horizontal selection switch MOS transistor, and reference numeral 7 denotes a source follower load MOS transistor. Reference numeral 8 denotes a dark output transfer MOS transistor, reference numeral 9 denotes an image signal output transfer MOS transistor, reference numeral 10 denotes a dark output storage capacitor $C_{TN}$, and reference numeral 11 denotes an image signal output storage capacitor $C_{TS}$. Reference numeral 12 denotes a horizontal transfer MOS transistor, reference numeral 13 denotes a horizontal output line reset MOS transistor, reference numeral 14 denotes a differential output amplifier, reference numeral 15 denotes a horizontal scanning circuit, and reference numeral 16 denotes a vertical scanning circuit. FIG. 3 shows a cross-sectional view of a wiring portion for two photoelectric conversion elements in the Y direction. In the figure, reference numeral 17 denotes a p-type well, reference numeral 18 denotes a gate oxide film, reference numeral 19 denotes a first polysilicon, reference numeral 20 denotes a second polysilicon, and reference numeral 21 denotes an n+ floating diffusion (FD) portion. The FD portion 21 is connected to two photoelectric conversion units via two transfer MOS transistors. While drains of the two transfer switch MOS transistors 3 and the FD portion 21 share a common region for finer design rules and for improvement in sensitivity through reduction in the capacitance of the FD portion 21 in the figure, the FD portion 21 may be connected with an aluminum (Al) wiring.

Figure 4:
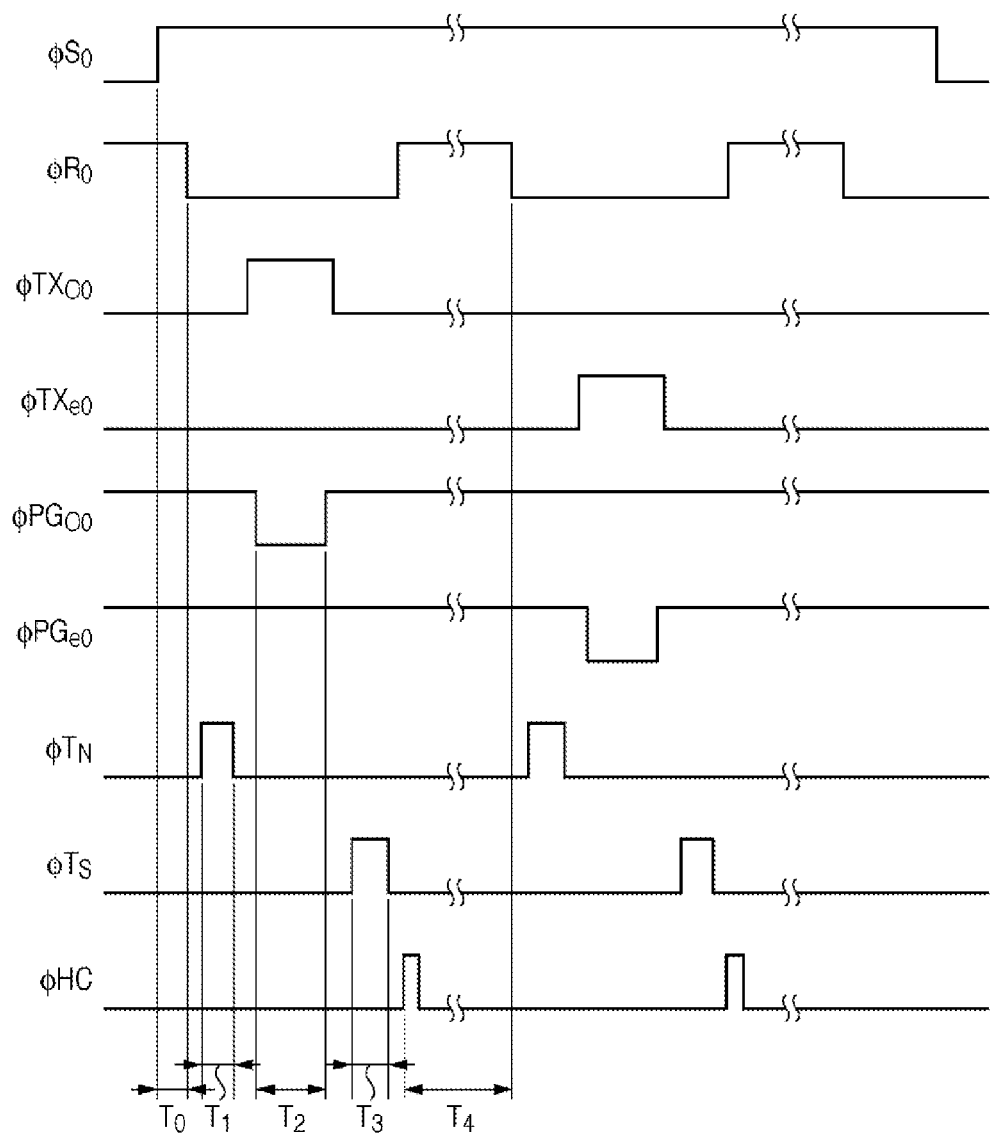
FIG. 4 is a drive timing chart for an image sensor.

Next, operation in the case of independent output from all of the pixels in the image sensor 107 shown in FIGS. 2 and 3 will be described with reference to a timing chart of FIG. 4.

First, a timing signal output from the vertical scanning circuit 16 brings a control pulse φL to a high level to reset a vertical output line. Furthermore, control pulses $\phi R_0$, $\phi PG_{00}$, $\phi PG_{e0}$ are brought to high levels to turn on the reset MOS transistor 4, and bring the first polysilicon 19 of the photogate 2 to a high level. At time $T_0$, a control pulse $\phi S_0$ is brought to a high level to turn on the selection switch MOS transistor 6, and select pixels of first and second lines. Next, the control pulse $\phi R_0$ is brought to a low level to stop resetting the FD portion 21 and bring the FD portion 21 into a floating state, making a through pathway between a gate and a source of the source follower amplifier MOS transistor 5. Then, at time $T_1$, a control pulse $\phi T_N$ is brought to a high level to output the dark voltage of the FD portion 21 to the storage capacitor $C_{TN}$ 10 in accordance with source follower operation.

Next, in order to obtain photoelectric conversion outputs from the photoelectric conversion units 1 of the first line, a control pulse $\phi TX_{00}$ to the first line is first brought to a high level to bring the transfer switch MOS transistor 3 into a conduction state. Then, the control pulse $\phi PG_{00}$ is lowered to a low level at time $T_2$. At this point, a relationship in terms of voltage is preferable which shallows a potential well spreading under the photogate 2 to transfer a light generation carrier to the FD portion 21 completely. Thus, as long as the complete transfer is possible, the control pulse $\phi TX$ may be a fixed potential rather than a pulse.

The transfer to the FD portion 21 at the time $T_2$ of electric charges from the photoelectric conversion units 1 of the first line of the photodiode causes the potential of the FD portion 21 to vary depending on light. Since the source follower amplifier MOS transistor 5 is in a floating state at this point, the potential of the FD portion 21 is output to the storage capacitor $C_{TS}$ 11 with a control pulse $\phi T_S$ brought to a high level at time $T_3$. At this point, the dark outputs and image signal outputs of the pixels of the first line are respectively stored in the storage capacitors $C_{TN}$ 10 and $C_{TS}$ 11. At time $T_4$, with a control pulse $\phi HC$ temporarily brought to a high level, the horizontal output line reset MOS transistor 13 is brought into a conduction state to reset the horizontal output line, and in a horizontal transfer period, a scan timing signal of the horizontal scanning circuit 15 causes the horizontal output line to output the dark outputs and image signal outputs of the pixels. At this point, a differential amplifier 14 for the storage capacitors $C_{TN}$ 10 and $C_{TS}$ 11 is used to take a differential output $V_{OUT}$, signals with good S/N ratio are obtained from which random noise and fixed pattern noise of pixels have been removed.

Furthermore, the dark outputs and image signal outputs of the photoelectric conversion units 1 of the first line are at the same time stored in the storage capacitors $C_{TN}$ 10 and $C_{TS}$ 11 connected to each vertical output line. Thus, when the horizontal transfer MOS transistors 12 are sequentially turned on, electric charges stored in each of the storage capacitors $C_{TN}$ 10 and $C_{TS}$ 11 are sequentially read out to the horizontal output line and output from the differential amplifier 14.

Furthermore, the present embodiment describes a configuration in which the differential output $V_{OUT}$ is obtained in the chip. However, the use of a conventional external CDS (Correlated Double Sampling) circuit, not in the chip, also produces a similar advantageous effect.

On the other hand, after outputting the image signal outputs from the photoelectric conversion units 1 of the first line to the storage capacitors $C_{TS}$ 11, the control pulse $\phi R_0$ is brought to the high level to bring the reset MOS transistor 4 into a conduction state, and reset the FD portion 21 to a power supply level $V_{DD}$. After completing horizontal transfer of electric charges of the first line, reading from the photoelectric conversion units 1 of the second line is carried out. In the reading of the second line, a control pulse $\phi TX_{e0}$ and a control pulse $\phi PG_{e0}$ are first driven, as in the case of the first line described above. Next, a high pulse is supplied for each of the control pulse $\phi T_N$ and $\phi T_S$ to take and store dark outputs and image signal outputs in the storage capacitors $C_{TN}$ 10 and $C_{TS}$ 11, respectively.

The driving described above allows each of the first and second lines to be read out independently. After this, scanning carried out by the vertical scanning circuit 16 and similar reading of (2n+1)-th and (2n+2)-th lines (n=1, 2, . . . ) allow independent outputs from all of the photoelectric conversion units 1. More specifically, in the case of n=1, a control pulse $\phi S_1$ is first brought to a high level, a control pulse $\phi R_1$ is then brought to a low level, and control pulses $\phi T_N$ and $\phi TX_{01}$ are subsequently brought to high levels. Then, with a control pulse $\phi PG_{01}$ brought to a low level, a control pulse $\phi T_S$ brought to a high level, and a control pulse $\phi HC$ temporarily brought to a high level, dark outputs and image signal outputs are read out from the respective photoelectric conversion units 1 of the third line. Subsequently, with control pulses $\phi TX_{e1}$ and $\phi PG_{e1}$, and a control pulse applied in the same way as described above, dark outputs and image signal outputs are read out from the respective photoelectric conversion units 1 of the fourth line. Next, a phase difference detection method in the present embodiment will be described.

FIGS. 5A and 5B are diagrams illustrating the configurations of pixels of the image sensor 107 which have a pupil divide function. FIG. 5A is a diagram illustrating the configuration of a central image height pixel on the optical axis of a photographing optical system, not shown, whereas FIG. 5B is a diagram illustrating the configuration of a peripheral image height pixel which has an image height horizontally. Reference numeral 60 denotes a photoelectric conversion element, which is provided with a pupil divide function by arranging two photoelectric conversion elements 60a, 60b per pixel.

Reference numeral 61 denotes an on-chip microlens, which effectively collects light onto the photoelectric conversion element 60. The on-chip microlens 61 has its optical axis aligned with the boundary between the photoelectric conversion elements 60a, 60b in FIG. 5A, whereas the on-chip microlens 61 has its optical axis deviated from the boundary between the photoelectric conversion elements 60a, 60b in FIG. 5B. Reference numeral 62 denotes a planarized film, reference numeral 63 denotes a color filter, reference numeral 64 denotes wiring, and reference numeral 65 denotes an interlayer insulation film. The two photoelectric conversion elements 60a, 60b correspond to the two photoelectric conversion units 1 in each row in FIG. 2. Furthermore, in a case in which focus detection operation is to be carried out, outputs from the two photoelectric conversion elements 60a, 60b are treated as separate signals, while in a case in which general shooting is to be carried out, the outputs of the two photoelectric conversion elements 60a, 60b are added and treated as a pixel signal for one pixel.

Next, the operation for detecting a pair of signals for phase difference detection with the use of the image sensor 107 in the present embodiment will be described.

Figure 6A:
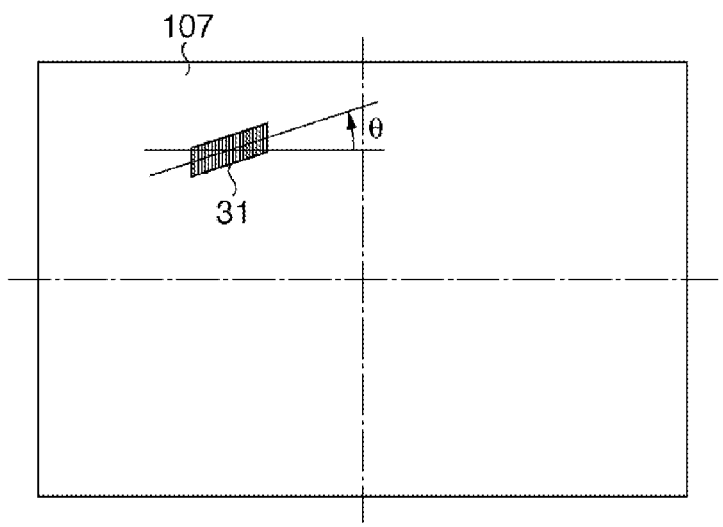
FIGS. 6A to 6C are diagrams illustrating a focus detection area, a pixel block for focus detection, and a pixel for focus detection.
Figure 6C:
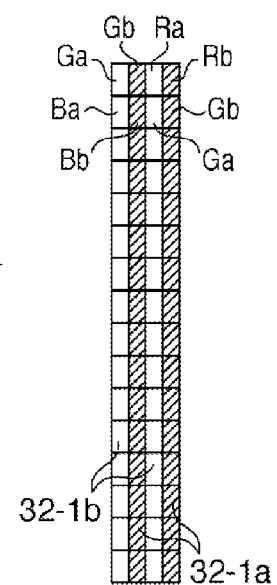
Figure 6B:
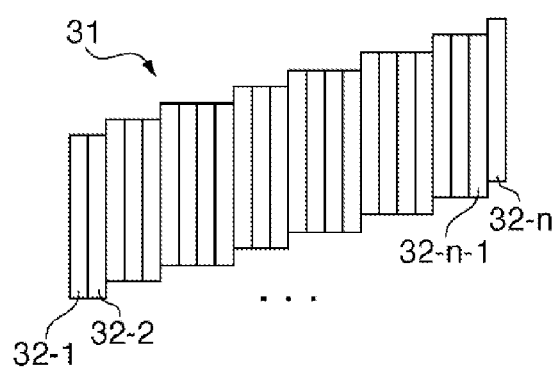

FIGS. 6A to 6C are diagrams for explaining a focus detection area on the image sensor 107, which show a state of the image sensor 107, viewed from the photographing lens 100 side on a light receiving surface of the image sensor 107. FIG. 6A shows the shape of an area for processing signals for phase difference detection (hereinafter, referred to as a "focus detection area") 31 positioned diagonally on the image sensor 107, whereas FIG. 6B shows an enlarged view of the focus detection area 31.

Reference numerals 32-1, 32-2, . . . , 32-n-1, 32-n each denote pixel blocks for focus detection, each of which is composed of multiple pixels. FIG. 6C shows the configuration of the pixel block 32-1 for focus detection, and the other pixel blocks for focus detection also have the same configuration.

As shown in FIG. 6C, color filters in a Bayer arrangement are arranged in each pixel included in the pixel block 32-1 for focus detection, in order to carry out normal shooting. Then, in the same pixel, the addition of the outputs of two photoelectric conversion elements with the color filters of the same color arranged (Ga and Gb, Ra and Rb, Ba and Bb) allows an image signal to be obtained during normal shooting.

On the other hand, in a case in which focus detection processing is to be carried out, an A image signal from the pixels for focus detection in the pixel block 32-1 is obtained by adding all of outputs from the photoelectric conversion element 32-1*a* in the pixel block 32-1, which corresponds to the photoelectric conversion 60*a*. Furthermore, a B image signal from the pixels for focus detection in the, pixel block 32-1 is obtained by adding all of outputs from the photoelectric conversion element 32-1*b* in the pixel block 32-1, which corresponds to the photoelectric conversion 60*b*. When outputs from the photoelectric conversion elements 32-1*a*, 32-1*b* are added respectively to obtain an A image signal and a B image signal as described above, the S/N for pixel signals at a low luminance can be made effective.

Then, an A image signal and an B image signal from each of the pixel blocks for focus detection 32-1, 32-2, . . . , 32-n-1, 32-n in FIG. 6B can be used to generate a pair of signals for phase difference detection.

While signals in the pixel block are added as the A image signal and the B image signal here, the pixels for focus detection may be configured in such a way that signals are not added in the pixel block.

The focus detection area 31 in the present embodiment is matched to an angle of tilt θ for barycentric positions 78*a*, 78*b* of A image and B image pupil areas, caused by vignetting as described above. For the angle θ of the focus detection area 31, the clipping angle is made by laterally bundling multiple parallel blocks, because longitudinal steps of the pixel blocks 32-1 to 32-n have to be the integral multiple of the pixel unit of the image sensor 107.

Figure 7A:
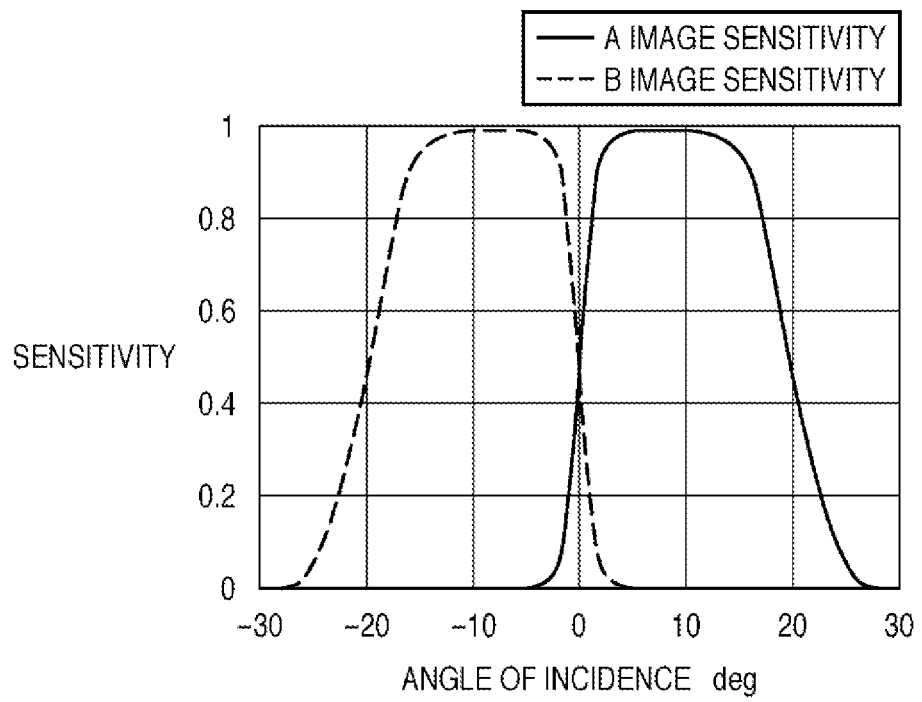
FIGS. 7A and 7B are diagrams for showing light receiving sensitivity characteristics for pupil divide pixels.
Figure 7B:
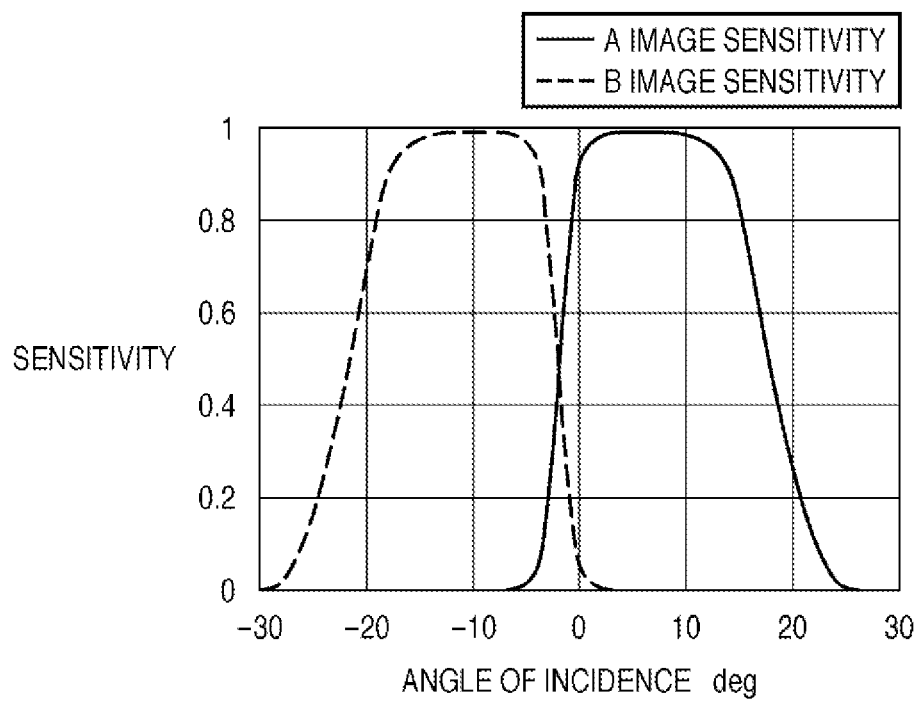

FIGS. 7A and 7B are diagrams for showing the light receiving sensitivity of a pixel with a pupil divide function, where the abscissa represents an angle of incidence and the ordinate represents a light receiving sensitivity. FIG. 7A shows light receiving sensitivities (referred to as an A image sensitivity and a B image sensitivity respectively in the figure) for each of two photoelectric conversion elements 60*a*, 60*b* of a central image height pixel. FIG. 7B shows light receiving sensitivities for each of two photoelectric conversion elements 60*a*, 60*b* of a peripheral image height pixel. As can be seen from FIGS. 7A and 7B, the sensitivities of the two photoelectric conversion elements 60*a*, 60*b* have symmetrical characteristics with respect to the angle of incidence of 0 degrees in the central image height pixel. On the other hand, the sensitivities of the two photoelectric conversion elements 60*a*, 60*b* have symmetrical characteristics with respect to the angle of incidence of about −2 degrees in the peripheral image height pixel.

Figure 8:
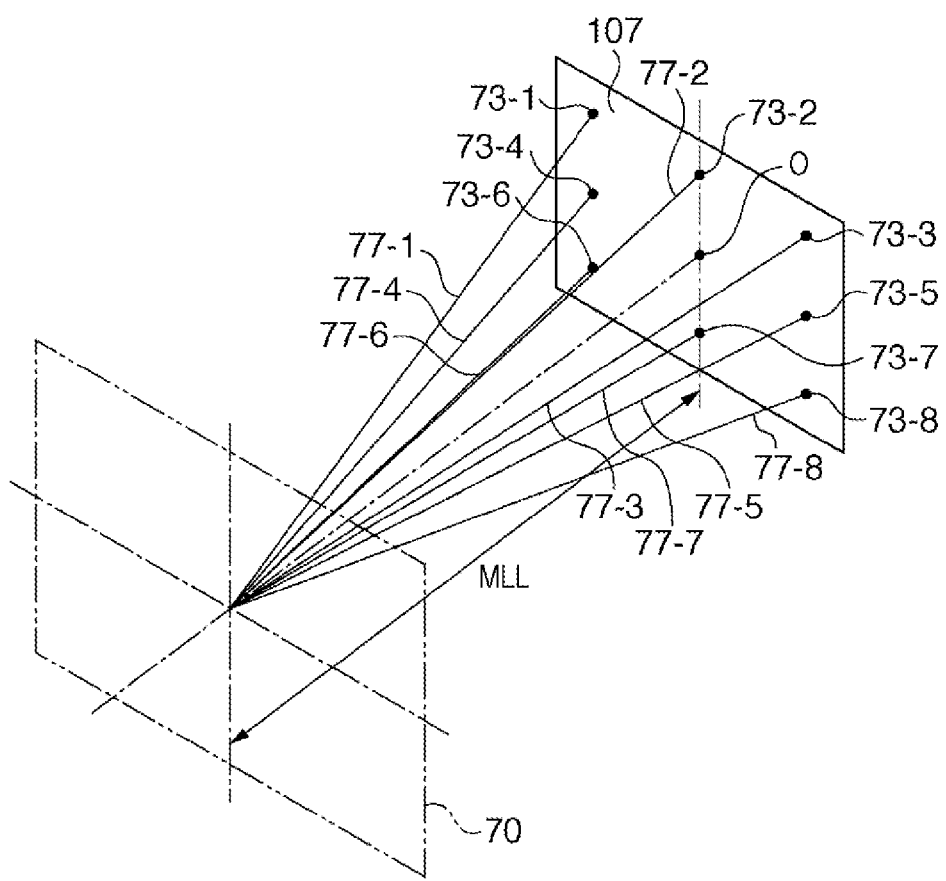
FIG. 8 is a diagram for explaining the light receiving sensitivity center of a pixel at each image height of an image sensor.

FIG. 8 is a diagram for explaining the light receiving sensitivity center of a pixel at each image height of an image sensor. The image height represents positional information on the focus state detecting position with respect to an angle of image sensing view. In FIG. 8, reference numeral 107 denotes an image sensor, and reference numeral 70 denotes a microlens (ML) pupil area. Reference symbol O denotes the intersection of a photographing optical system, not shown, in the image sensor 107 with the optical axis, and reference numerals 73-1 to 73-8 denote pixel positions at respective image heights.

At the central image height pixel O, assuming that the photoelectric conversion elements 60*a*, 60*b* are regarded as one light receiving area, the light receiving area center of the photoelectric conversion element 60 coincides with the optical axis of the on-chip microlens 61. As the image height is increased, the optical axis of the on-chip microlens 61 is gradually displaced, in such a way that the light receiving area center of the photoelectric conversion element 60 for a pixel is moved toward a predetermined point on the optical axis of an optical system, regardless of the image height. The distance from the image sensor 107 to the point toward which the light receiving region center is moved is here referred to as an on-chip microlens pupil distance MLL. Furthermore, the plane at the on-chip microlens pupil distance with the optical axis as a perpendicular is referred to as a ML pupil area 70. Reference numerals 77-1 to 77-8 denote angular deviations for the light receiving sensitivity center at each image height. As can be seen from the figure, the angular deviations for the sensitivity center are directed toward the optical axis of the pupil distance MLL, regardless of the image height.

FIGS. 9A to 9C are diagrams for explaining the shape of vignetting, where FIG. 9A is a perspective view whereas FIGS. 9B and 9C are projection views. In a case in which the X axis, the Y axis, and the Z axis are defined as shown in FIG. 9A, FIG. 9B shows a ML pupil area viewed from the Z(+) direction in FIG. 9A, whereas FIG. 9C is a view from the Y(−) direction in FIG. 9A. The photographing lens is normally composed of multiple lenses, and a peripheral pixel 73 located other than at the intersection of the optical axis of the photographing lens with the image sensor 107 has a light beam limited mainly by two exit windows. One of the exit windows is a lens frame with the smallest projection radius at the aperture position of lens holding frames on the side closer to a subject from among multiple lens frames, while the other is a lens frame with the smallest projection radius at the aperture position of lens holding frames on the side closer to the image sensor 107 from the aperture position. These two lens frames limit the light beam. The lens holding frame on the side closer to a subject is referred to as a first exit window 71 for the photographing lens, whereas the lens holding frame on the side closer to the image sensor 107 is referred to as a second exit window 72 for the photographing lens.

A projection exit window 71-1 is obtained by projecting the first exit window 71 onto the ML pupil area 70 from the peripheral pixel 73. A projection exit window 72-1 is obtained by projecting the second exit window 72 onto the ML pupil area 70 from the peripheral pixel 73. The peripheral pixel 73 receives light beams passing through a focus detection opening pupil 76 defined by the projection exit window 71-1 and the projection exit window 72-1. As shown in FIG. 5B, the peripheral pixel 73 is composed of the two photoelectric conversion elements 60*a* and 60*b*. The two photoelectric conversion elements 60*a* and 60*b* are designed each to receive light beams transmitted through different pupil positions of the photographing lens, through an on-chip microlens 61 formed on the photographing lens side.

The on-chip microlens 61 for the peripheral pixel 73 is located at a position shifted so as to be directed toward the optical axis of the ML pupil area. Therefore, as shown in FIG. 9B, the boundary line between an area 74*a* (hereinafter, referred to as an A image pupil area 74*a*) through which a light beam to be received by the photoelectric conversion element 60*a* passes and an area 74*b* (hereinafter, referred to as a B image pupil area 74*b*) through which a light beam to be received by the photoelectric conversion element 60*b* passes will pass through the optical axis of the photographing lens. In FIG. 9B, reference numeral 78*a* denotes the barycentric position of the A image pupil area 74*a*, whereas reference numeral 78*b* denotes the barycentric position of the B image pupil area 74*b*.

In FIG. 9C, reference numeral L71 denotes the distance from the image sensor 107 to the first exit window 71, whereas reference numeral L72 denotes the distance from the image sensor 107 to the second exit window 72. Reference numeral D71 denotes the diameter of the first exit window 71, whereas reference numeral D72 denotes the diameter of the second exit window 72. As can be seen from FIG. 9B, the A image pupil area 74a and the B image pupil area 74b have shapes which are not symmetrical with respect to the boundary line, and the barycentric positions 78a, 78b are not in a horizontal line.

In the peripheral pixel 73, an area through which a light beam to be received by the photoelectric conversion element 60a passes corresponds to the A image pupil area 74a shown in FIG. 9B, whereas an area through which a light beam to be received by the photoelectric conversion element 60b passes corresponds to the B image pupil area 74b shown in FIG. 9B. Furthermore, the barycentric positions of the pupil areas of the photoelectric conversion elements 60a, 60b correspond to the barycentric positions 78a, 78b shown in FIG. 9B.

When the coordinates of the barycentric position 78a are denoted by (xa, ya), whereas the coordinates of the barycentric position 78b are denoted by (xb, yb), the angle of tilt θ is obtained by the following relational expression:

$$\tan \theta = \{(ya-yb)/(xa-xb)\} \quad (1)$$

On the other hand, the coordinates of the barycentric positions 78a, 78b of the A and B image pupil areas can be obtained geometrically from the coordinates (xs, ys) represented as an image height for the pixel 73 on the image sensor 107, information on the first and second exit windows 71, 72, and the ML pupil distance MLL specific to the image sensor 107. The information on the first and second exit windows 71, 72 here represents the following information: that is, the distance L71 from the image sensor 107 to the first exit window 71; the distance L72 from the image sensor 107 to the second exit window 72; the diameter D71 of the first exit window 71; and the diameter D72 of the second exit window 72 in FIG. 9C.

When the type of the photographing lens 100 is changed, or when the zoom ratio or the F value is varied, the information on the exit windows also changes. Therefore, the exit window information corresponding to the type of the photographing lens 100, zoom ratio, and the F value is calculated in advance by optical calculation, while exit window information (lens information 34) under each condition of the photographing lens 100 is stored in a memory in the lens, so that the exit window information is transferred as necessary.

Figure 10:
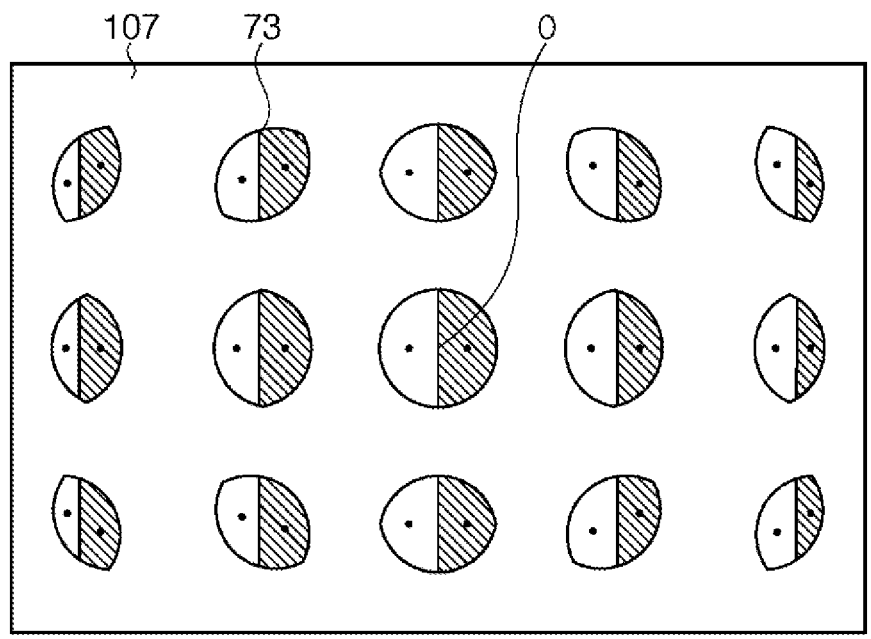
FIG. 10 is a projection view for explaining the shape of vignetting at each image height.

FIG. 10 shows the shape of vignetting for each image height on the image sensor 107, where a shaded portion represents a sensitivity area of the A image whereas a white region represents a sensitivity area of the B image. Furthermore, black points represent the barycentric positions of the respective areas.

As can be seen from FIG. 10, while the barycenters of the A image pupil area and B image pupil area are kept in a horizontal line in the center of the image (on the optical axis of the photographing lens), and in the horizontal direction and vertical direction with respect to the center of the image, the barycenters of the A image pupil area and B image pupil area are deviated from the horizontal position in diagonal directions with respect to the center of the image. The deviations of the barycenters coincide with the tilt of the direction of image deviation in a defocus image.

FIGS. 11A to 11E are diagrams for explaining the tilt of a subject image and the deviation of a phase difference signal, in a case in which the image deviation in a diagonal position of the image sensor 107 is caused in an oblique direction. It is to be noted here that an image viewed from the back surface (the Z axis (−) direction) of the image sensor 107 is rotated by 180 degrees in order to show a shot image as an erect image.

Figure 11A:
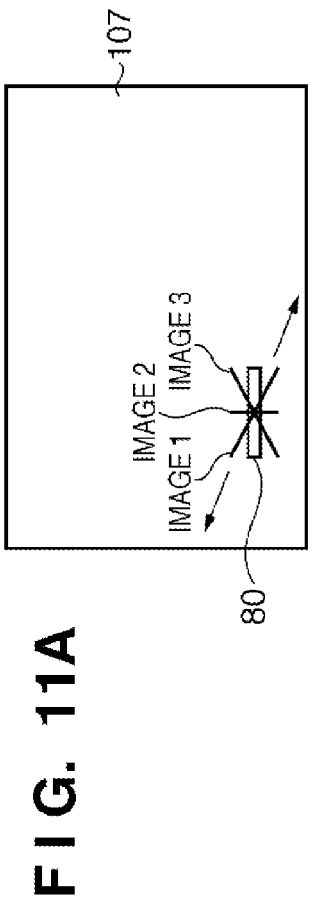
FIGS. 11A to 11E are diagrams for explaining the tilt of a subject image and the deviation of a phase difference signal.
Figure 11B:
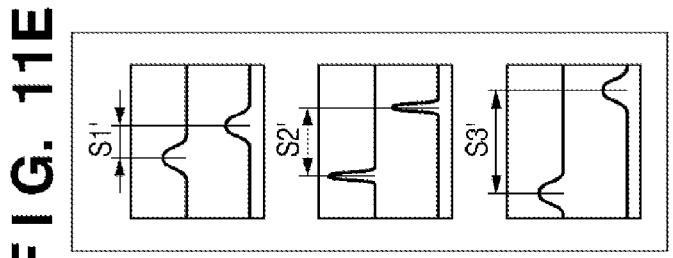
Figure 11C:
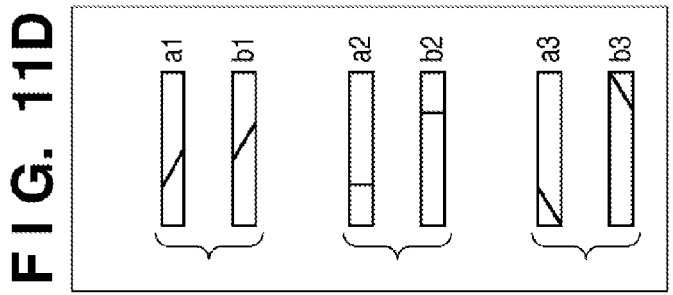
Figure 11D:
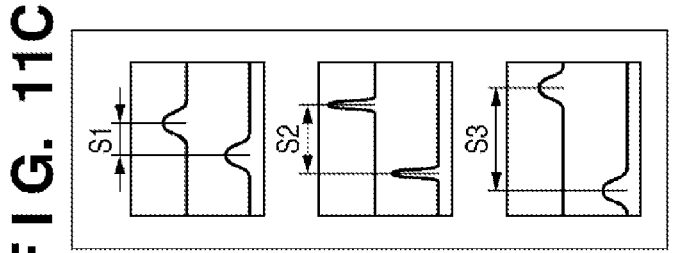
Figure 11E:
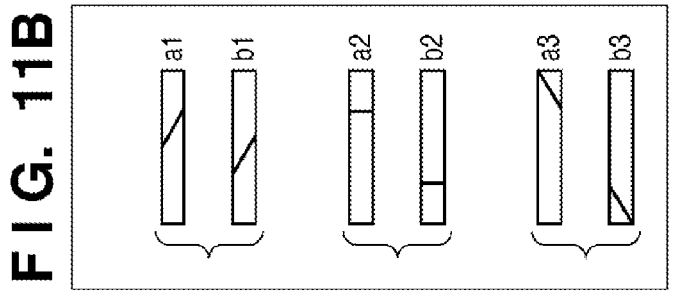

FIG. 11A shows a processing area 80 for phase difference signals in a diagonal focus detecting position, which assumes a diagonally left tilted image 1, a vertical image 2, and a diagonally right tilted image 3 as subject images on the same distance measuring plane. Furthermore, among signals obtained from the processing area 80 for carrying out focus detection, signals obtained from columns of pixels of the photoelectric conversion element 60a are referred to as an A image signal, whereas signals obtained from columns of pixels of the photoelectric conversion element 60b are referred to as a B image signal. In this case, FIG. 11B shows the appearances of an A image and of a B image formed on the processing area 80 in front focus, and FIG. 11C shows so-called phase difference signals (A image signals, B image signals), which are signals obtained from columns of pixels in front focus, and the deviation thereof. Furthermore, FIG. 11D shows the appearances of an A image and of a B image formed on the processing area 80 in rear focus, and FIG. 11E shows phase difference signals (A image signals, B image signals), obtained from columns of pixels in rear focus, and the deviation thereof. Moreover, respective A images and respective B images, which correspond to the image 1, image 2, and image 3 as subject images, are referred to as a1, a2, and a3, and as b1, b2, and b3, respectively.

As can be seen from FIG. 11C, in a case in which the subject image is vertical in the front focus, the horizontal component of image deviation due to a defocus state coincides with the phase difference deviation S2 in the processing area 80. By contrast, in a case in which the subject image is tilted, there is a discrepancy between the horizontal component of image deviation due to a defocus state and the phase difference deviation (S1, S3) in the processing area 80. For example, for the diagonally left tilted image 1, the phase difference deviation S1 in the processing area 80 is smaller than the horizontal component S2 of image deviation due to a defocus state, while for the diagonally right tilted image 3, the phase difference deviation S3 in the processing area 80 is larger.

Similarly, as shown in FIG. 11E, in a case in which the subject image is vertical in the rear focus, the horizontal component of image deviation due to a defocus state coincides with the phase difference deviation S2' in the processing area 80. By contrast, in a case in which the subject image is tilted, there is a discrepancy between the horizontal component of image deviation due to a defocus state and the phase difference deviation (S1', S3') in the processing area 80.

FIGS. 12A to 12E are diagrams for explaining the tilt of a subject image and the deviation of a phase difference signal in the present embodiment. It is to be noted here that an image viewed from the back surface of the image sensor 107 is rotated by 180 degrees in order to show a shot image as an erect image.

Figure 12A:
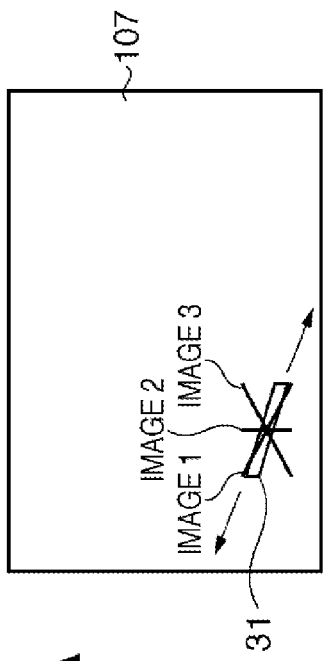
FIGS. 12A to 12E are diagrams for explaining the tilt of a subject image and the deviation of a phase difference signal.
Figure 12B:
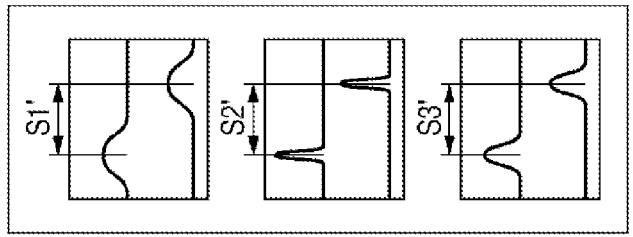
Figure 12C:
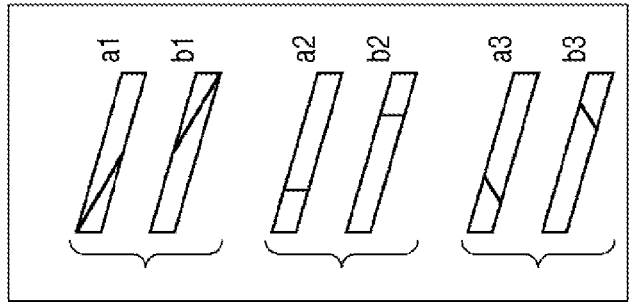
Figure 12D:
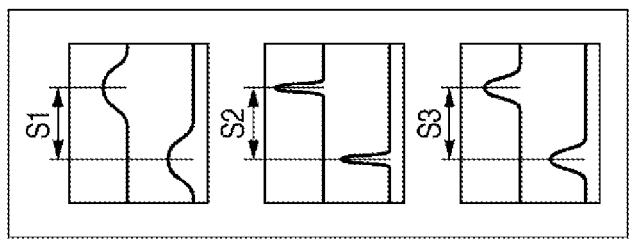
Figure 12E:
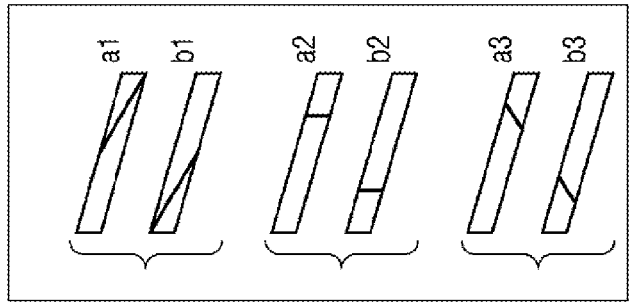

FIG. 12A shows a focus detection area 31 for phase difference signals in a diagonal focus detecting position, which assumes a diagonally left tilted image 1, a vertical image 2, and a diagonally right tilted image 3 as subject images on the same distance measuring plane. FIG. 12B shows the appearances of an A image and of a B image formed on the focus detection area 31 in front focus, and FIG. 12C shows the deviations of A image signals and B image signals, which are obtained from each pixel block for focus detection in front focus. Furthermore, FIG. 12D shows the appearances of an A image and of a B image formed on the focus detection area 31 in rear focus, and FIG. 12E shows the deviations of A image signals and B image signals, which are obtained from each pixel block for focus detection in rear focus, and the deviation thereof. Moreover, respective A images and respective B images, which correspond to the image 1, image 2, and image 3 as subject images, are referred to as a1, a2, and a3, and as b1, b2, and b3, respectively.

As can be seen from FIG. 12C, the horizontal components of image deviations due to defocus states all coincide with the phase difference deviations (S1, S2, S3) in the focus detection area 31 in the front focus, regardless of the tilt of the subject image.

Similarly, as can be seen from FIG. 12E, the horizontal components of image deviations due to defocus states also all coincide with the phase difference deviations (S1', S2', S3') in the focus detection area 31 in the rear focus, regardless of the tilt of the subject image.

As described above, matching the angle of the focus detection area 31 with the angle of the direction of image deviation allows the detection accuracy of the focus state to be improved.

With images of FIGS. 13A and 13B as examples, the operation for detecting the defocus amount in the present embodiment will be described below with reference to a flowchart of FIG. 14.

Figure 13A:
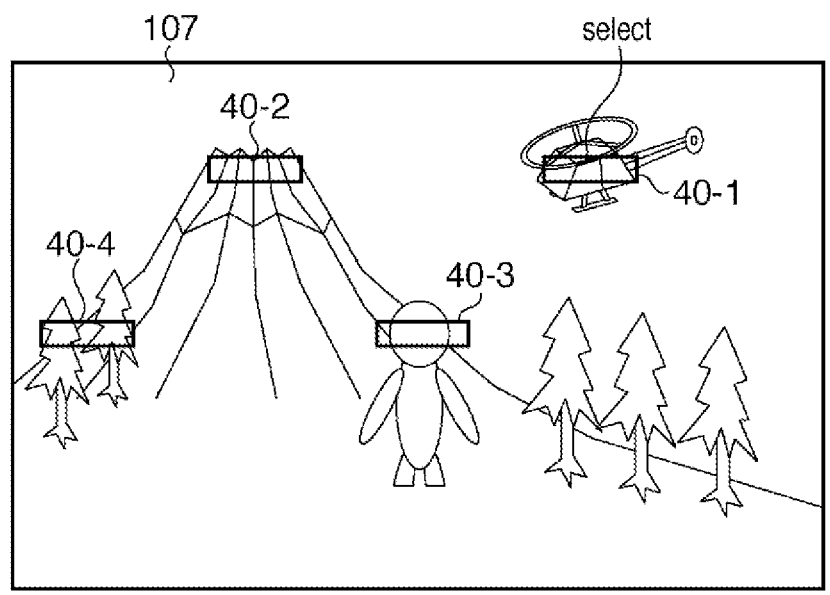
FIGS. 13A and 13B are diagrams illustrating examples of a focus detecting position and of a focus detection area in an image.
Figure 13B:
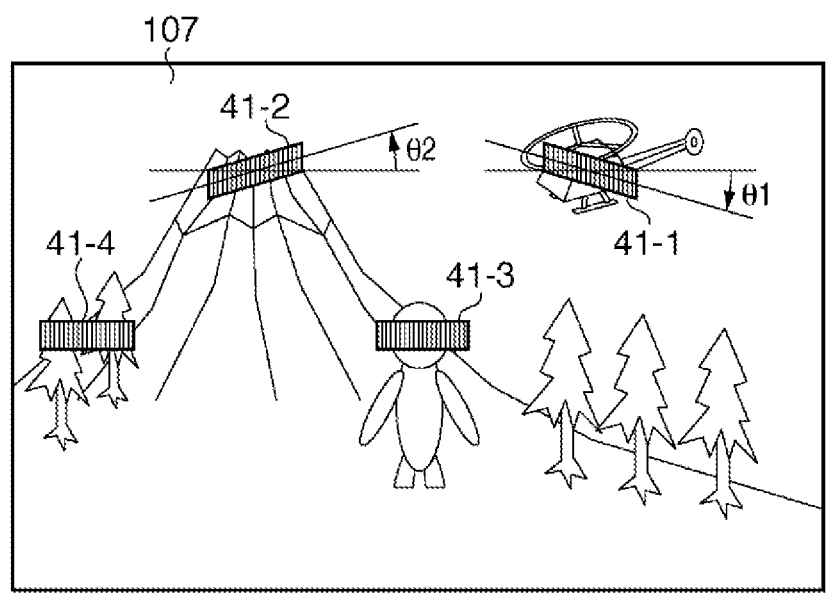
Figure 14:
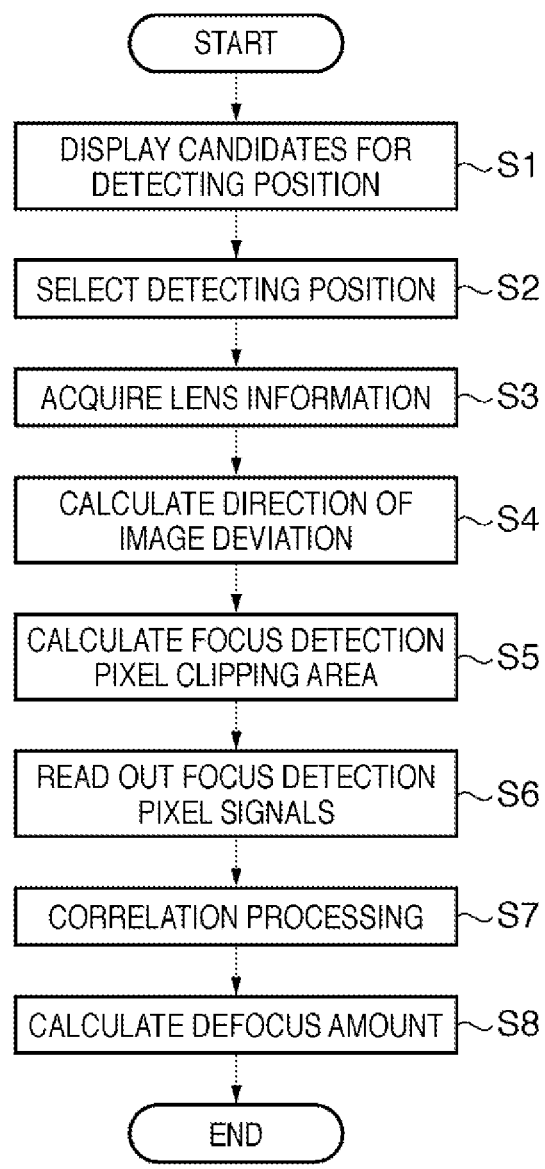
FIG. 14 is a flowchart showing the operation for detecting the defocus amount.

In FIGS. 13A and 13B, an image viewed from the back surface of the image sensor 107 is rotated by 180 degrees in order to show a shot image as an erect image. In FIG. 13A, reference numerals 40-1 to 40-4 denote candidates for the position in which a focus state is to be detected, and FIG. 13B shows focus detection areas 41-1 to 41-4 in each candidate for the detecting position.

In the present embodiment, a focus detection area is set which corresponds to a selected focus state detecting position, and on the basis of the phase difference between two images corresponding to the focus detection area, the defocus amount in the focus detection area is detected. A case will be described here in which the photographer selects an area away from the center of the image (peripheral area) in FIG. 13A, from among multiple candidates for the position in which a focus state is to be detected.

First, with the use of image information, for example, contrast signals for an image, candidates for the detecting position are automatically detected from a subject image and displayed (step S1). Next, in response to the selection of any one (the candidate 40-1 for the detecting position denoted by the term "select" in FIG. 13A) of the candidates for the detecting position (step S2), lens information 34 (exit window information) is acquired (step S3). At this point, current exit window information on the photographing lens 100 is acquired as the lens information 34 by accessing a memory in the lens through the CPU 121. As described above, it is possible to calculate the barycentric positions of the A and B image pupil areas on the basis of the focus detection positional information 35 and the lens information 34 (exit window information), and the ML pupil distance MLL specific to the image sensor 107. Then, the arithmetic circuit 33 calculates the barycenters of the A image and of the B image to acquire the direction of image deviation represented by the expression (1) described above, that is, the tilt ($\theta 1$ here) of the focus detection area 31 (step S4).

In this case, for example, in a camera system in which lens information is mostly unchanged as in the case of a fixed focus lens, it is enough to change only the clipping angle in response to the focus detection positional information. In the case of specifications in which the focus detecting position is unchanged (specification in which the focus detecting position is not varied), for example, unless the specifications are employed in which a face detecting function changes the focus detecting position, it is enough to change only the clipping angle in response to the lens information.

Next, on the basis of the direction of image deviation (tilt $\theta 1$) obtained by the arithmetic circuit 33, the shape (clipping area) of the focus detection area (focus detection area 41-1 in FIG. 13B here) is calculated by the CPU 121 (step S5).

Then, signals are selectively read out from pixels for focus detection in the focus detection area set in step S5 (step S6), and on the basis of a pair of signals for phase difference detection, obtained from A image signals and B image signals, autocorrelation processing is carried by the CPU 121 (step S7). The processing described above allows the defocus amount of the photographing optical system to be detected (step S8). The autocorrelation processing in step S7 refers to an approach for calculating the deviation of the phase difference between a pair of signals for phase difference detection with a high degree of accuracy, and is a method commonly used as focus detection operation in a phase difference detection method. Therefore, a detailed description of the approach will be omitted here.

The processing described above allows a focus detection area matched with the direction of image deviation to be selected even in a peripheral part of an image.

It should be noted that while the method of selectively reading out pixel signals in the focus detection area 31 has been described here as a method for clipping the focus detection area 31 at an angle, a method may be employed in which only pixel signals in the focus detection area 31 are processed after reading out all of the pixels.

Furthermore, in the processing described above, for example, when the zoom ratio of the photographing lens 100 is changed, the direction of image deviation due to vignetting will be changed even in the same focus detecting position. In such a case, repeating the flow described above allows lens information to be appropriately acquired to set an optimum clipping angle, thereby enabling detection errors to be reduced.

The CPU 121 calculates, on the basis of the detected defocus amount, the in-focus position for the focus lens of the third group of lenses 105 included in the photographing lens 100. Then, driving the third group of lenses 105 through the focus driving circuit 126 and the focus actuator 114 allows auto-focusing (AF) in all of the zoom ratio to be carried out.

As described above, according to the present embodiment, the focusing area is clipped at an angle with the direction of the pixel arrangement, depending on lens information (the zoom ratio and the F value) and the image height of the focusing area, so as to correspond to vignetting of the photographing optical system. This allows detection errors to be reduced in tilted subject images which degrade the focus detection performance due to vignetting.

(Second Embodiment)

Next, a second embodiment of the present invention will be described. It should be noted that since the entire camera has the same configuration as described in the first embodiment, description of the configuration will be omitted here.

While the first embodiment described above allows any area to be set as the focusing area depending on an image to be shot, the present embodiment is different from the first embodiment in that the focus detection areas are fixed.

Figure 15A:
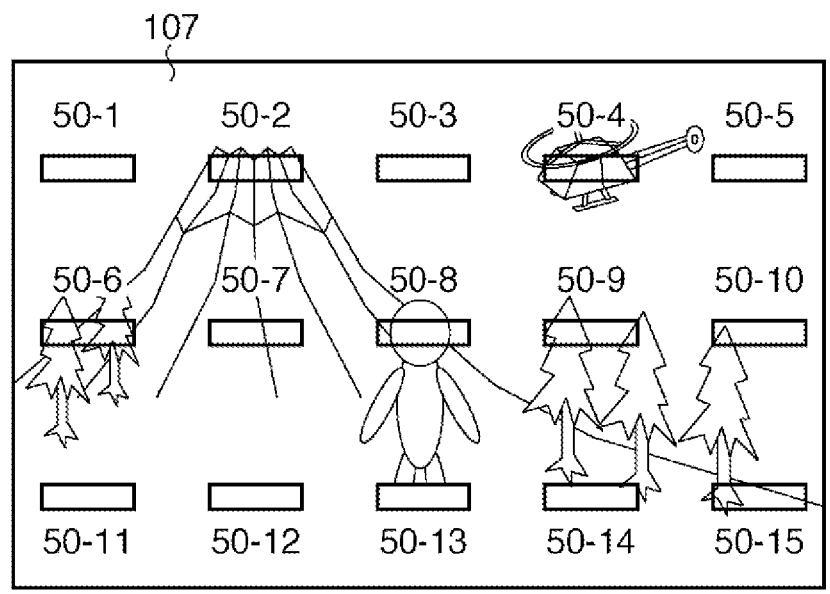
FIGS. 15A and 15B are diagrams illustrating examples of a focus detection frame and of a focus detection area.
Figure 15B:
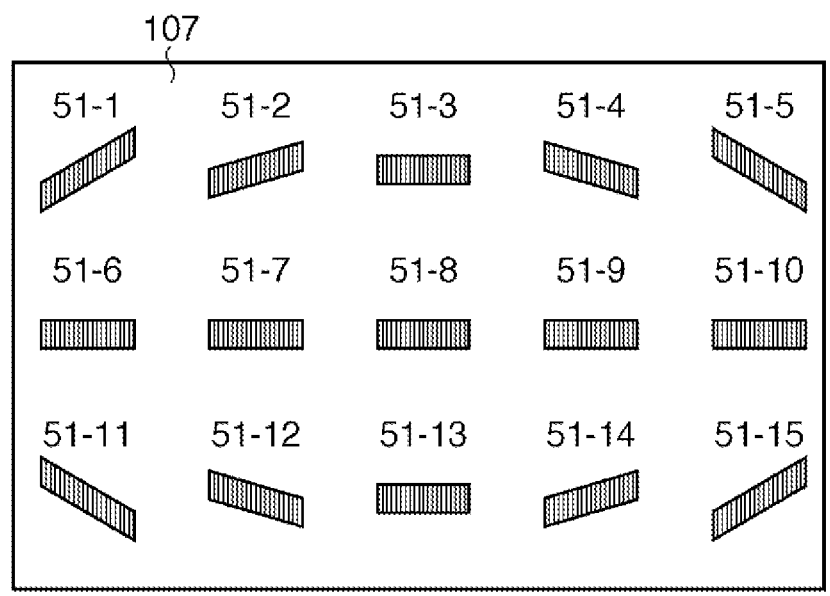

FIGS. 15A and 15B are diagrams illustrating focus detection areas in the second embodiment of the present invention.

In FIG. 15A, reference numerals 50-1 to 50-15 denote fifteen fixed focus detection frames, and in FIG. 15B, reference numerals 51-1 to 51-15 denote fifteen fixed focus detection areas.

In the present embodiment, a case of a fixed focus lens is assumed, or a case is assumed in which the shape of vignetting is not really changed even if the zoom ratio of the lens is varied. In this case, since the direction of image deviation for each image height has a predetermined angle, the need to change the clipping area in the image sensor is eliminated.

Figure 16:
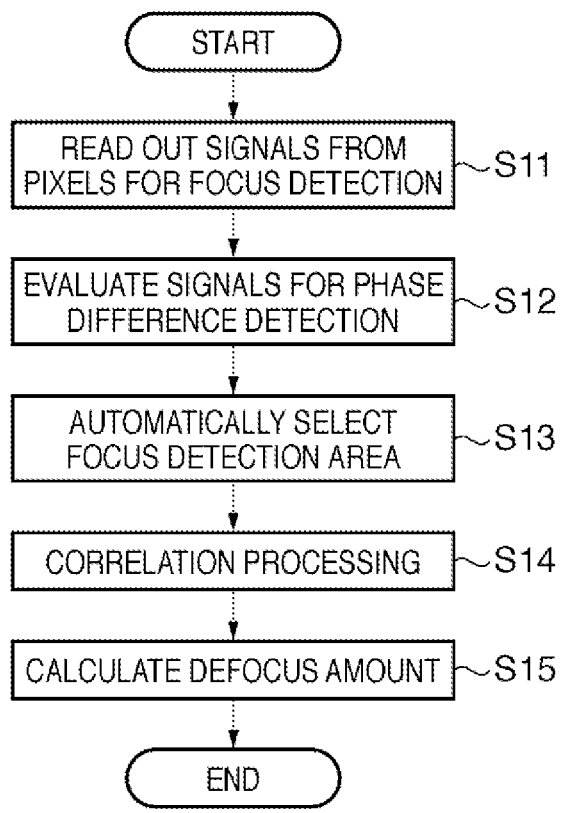
FIG. 16 is a flowchart showing the operation for detecting the defocus amount.

With images of FIGS. 15A and 15B as examples, the operation for detecting the defocus amount in the present embodiment will be described below with reference to a flowchart of FIG. 16.

When a shutter button, not shown, is pressed halfway, signals are read out from pixels for focus detection in the focus detection areas 51-1 to 51-15 corresponding to the fifteen focus detection frames 50-1 to 50-15 (step S11). The degree of coincidence and contrast for a pair of phase difference signals (A image signals and B image signals) obtained are evaluated (step S12), and a focus detection area that is the most suitable as a candidate for the focus detecting position is automatically selected (step S13). It should be noted that it is conceived that, for example, a focus detection area containing a face or a subject closest to the camera 200 is selected as how to select the focus detection area. However, control may be exercised so as to select a focus detection area on the basis of arbitrary condition. Then, on the basis of a pair of signals for phase difference detection, obtained from A image signals and B image signals, autocorrelation processing is executed by the CPU 121(step 14), and the defocus amount of the photographing optical system is detected (step S15).

As described above, according to the present embodiment, a focus detection area with a clipping angle optimum for an image height in the focus detection area can be clipped. Therefore, detection errors can be reduced in tilted subject images which degrade the focus detection performance due to vignetting.

It should be noted that cases have been described in the first and second embodiments described above in which a pupil divide function is provided by dividing light receiving portions of some pixels of the image sensor 107 into two parts. However, the present invention is not limited to these cases, and as shown in Japanese Patent Application Laid-Open No. 2000-156823, when a pupil divide function is provided by locating a sensitivity region of a light-receiving portion at a position shifted with respect to the optical axis of anon-chip microlens, a similar advantageous effect an be also obtained. Furthermore, as shown in Japanese Patent Application Laid-Open No. 2000-156823, when pixels for focus detection with different pupils are partially arranged for some of standard pixels to carry out focus detection on the basis of discrete pupil divide images, a similar advantageous effect an be also obtained.

Figure 17A:
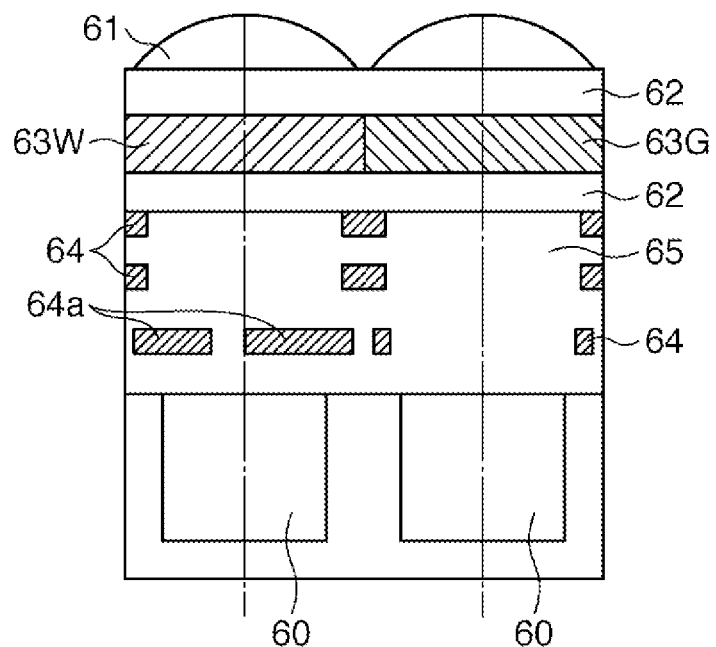
FIGS. 17A and 17B are diagrams illustrating the structures of pixels of an image sensor which have a pupil divide function.
Figure 17B:
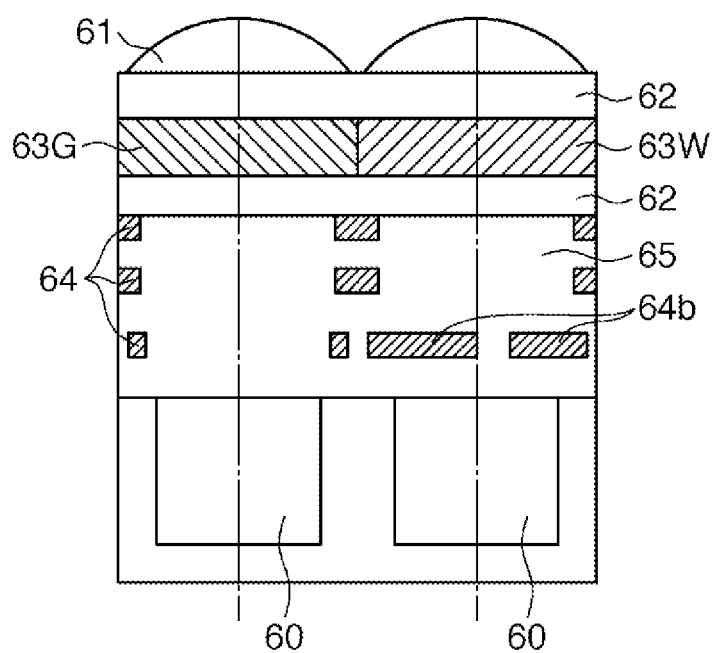

FIGS. 17A and 17B are diagrams illustrating the structures of pixels of an image sensor which have a pupil divide function. Reference numeral 61 denotes an on-chip microlens, which effectively collects light onto a photoelectric conversion element 60. Reference numeral 62 denotes a planarized film, reference numeral 63 denotes a color filter, reference numeral 64 denotes a wiring, and reference numeral 65 denotes an interlayer insulation film.

FIG. 17A is a diagram illustrating a focus detection pixel (left pixel) in which the light receiving sensitivity has a rightward sensitivity peak and a standard pixel (right pixel). FIG. 17B is a diagram illustrating a standard pixel (right pixel) and a focus detection pixel (left pixel) in which the light receiving sensitivity has a leftward sensitivity peak. In FIG. 17A, the lowest wiring layer 64a with an opening shifted to the left provides a pupil divide function with a rightward sensitivity peak. In FIG. 17B, the lowest wiring layer 64b with an opening shifted to the right provides a pupil divide function with a leftward sensitivity peak. Furthermore, the color filter 63W of the focus detection pixel unit is a transparent layer in order to increase the amount of light.

FIGS. 18A to 18C are diagrams for explaining a focus detection area on the image sensor 107, which shows a state of the image sensor 107 as viewed from the photographing lens 100 side on a light receiving surface of the image sensor 107. FIG. 18A shows the shape of a focus detection area 31 positioned diagonally on the image sensor 107.

FIG. 18B shows an enlarged view of the focus detection area 31. Reference numerals 32-1, 32-2, . . . , 32-n-1, 32-n denote pixel blocks for focus detection, each of which is composed of multiple pixels.

FIG. 18C is a diagram illustrating a pattern structure of pixels arranged in the image sensor 107, which is an enlarged view of a portion 107-1 on the image sensor 107 in FIG. 18B. As shown in FIG. 18C, a pair of pixels a, b for focus detection is discretely disposed in a block of 8×8 pixels as a basic pattern, and color filters in a Bayer arrangement are arranged in a standard pixel portion. The pixel block 32-1 includes eight pairs of focus detection pixels vertically arranged therein, and the outputs from focus detection a and focus detection b are respectively added to obtain an A image signal and a B image signal of the pixels for focus detection in the pixel block 32-1. As described above, when the outputs for the eight focus detection pixels in the pixel block 32-1 are added to obtain an A image signal and a B image signal, the S/N for pixel signals at a low luminance can be made effective.

Then, A image signals and B image signals from each of the pixel blocks for focus detection 32-1, 32-2, . . . , 32-n-1, 32-n in FIG. 18B can be used to generate a pair of signals for phase difference detection.

Figure 20A:
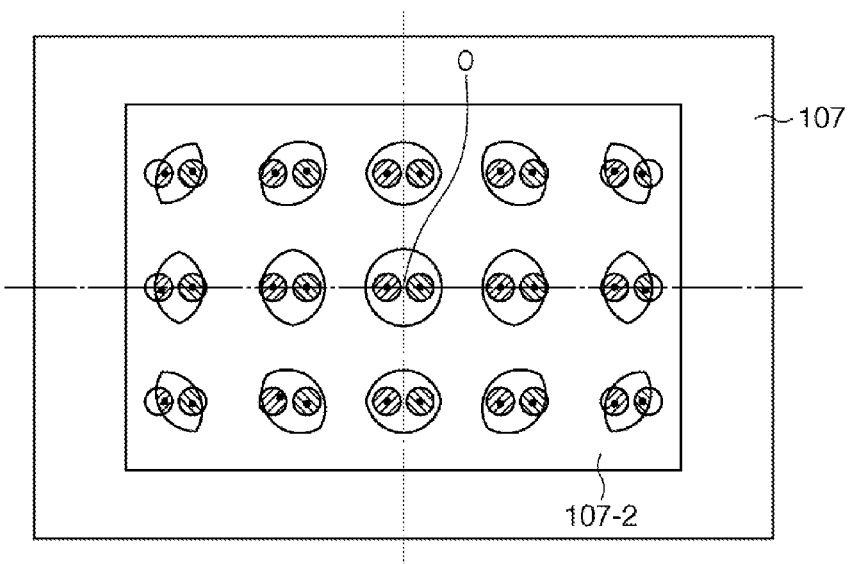
FIG. 20A is a projection view for explaining the shape of vignetting at each image height.
Figure 20B:
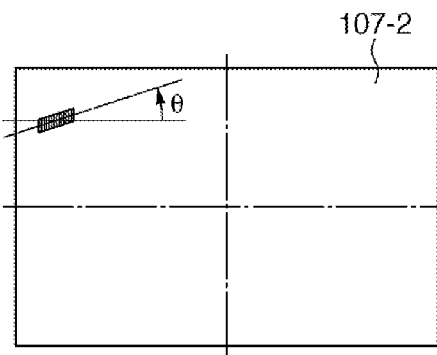
FIGS. 20B and 20C are diagrams for explaining a focus detection area on an image sensor.
Figure 20C:
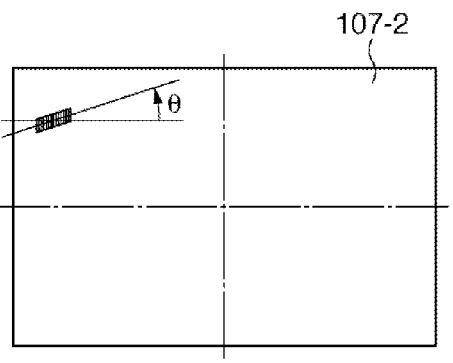

As described above, while a method for applying the present embodiment in focus detection pixels arranged on an imager has been described, the present embodiment may further be applied to a focus detection apparatus with a secondary imaging optical system which has been conventionally used in single-lens reflex cameras (FIG. 19). In this case, a sensor for focus detection has a configuration in which multiple square pixels are arranged, as in the case of the image sensor, thereby allowing the clipping shape to be arbitrarily selected. FIG. 20A shows a state in which pupil shapes defined on a secondary image forming surface (107-2) are deformed due to vignetting of a lens. In this case, FIGS. 20B and 20C show that the detection pixel clipping shape is set in accordance with the tilt θ of the barycenter. With the use of this configuration, the advantageous effect of the present invention can be expected.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-289171, filed Nov. 11, 2008, and No. 2009-244890, filed Oct. 23, 2009, which are hereby incorporated by reference herein in their entirety.

The invention claimed is:

1. A focus detection apparatus for setting a focus detection area corresponding to a selected focus state detecting position, and detecting a defocus amount in the focus detection area on the basis of a phase difference between two images corresponding to the focus detection area, the focus detection apparatus comprising:

an image sensor comprising a plurality of pixels for focus detection configured to receive a pair of respective light beams transmitted through different pupil areas of a photographing lens, wherein a pair of image signals are output from the plurality of pixels for focus detection;

a determination unit configured to determine a tilt of the focus detection area, depending on positional information on the focus state detecting position with respect to an angle of image sensing view and exit window information on the photographing lens; and a detection unit configured to detect the defocus amount on the basis of a phase difference between a pair of images obtained from pixels for focus detection corresponding to the detection area with a tilt determined by the determination unit, from among the plurality of pixels for focus detection.

2. The focus detection apparatus according to claim 1, wherein the tilt is obtained by the following expression:

$$\tan \theta = \{(ya-yb)/(xa-xb)\}$$

where $\theta$ represents a tilt, the coordinates (xa, ya) represent coordinates of a barycentric position in the pixels for focus detection which receive one of the light beams transmitted through the different pupil areas, and the coordinates (xb, yb) represent the coordinates of the barycentric position in the pixels for focus detection which receive the other light beam.

3. The focus detection apparatus according to claim 1, wherein the respective pixels for focus detection have a pair of light receiving areas to receive a pair of respective light beams transmitted through different pupil areas of the photographing lens.

4. The focus detection apparatus according to claim 1, wherein the determination unit acquires a zoom ratio and an aperture value for the photographing lens, and obtains exit window information on the basis of the acquired zoom ratio and aperture value.

5. The focus detection apparatus according to claim 1, wherein the focus detection area has a configuration in which a plurality of pixel blocks with the pixels for focus detection vertically arranged are arranged in the direction of the tilt, and
the detection unit detects the defocus amount on the basis of a phase difference between a pair of signals obtained for each of the pixel blocks by adding signals obtained on the basis of light beams transmitted through a same pupil area.

6. A focus detection apparatus for setting a focus detection area corresponding to a selected focus state detecting position, and detecting a defocus amount in the focus detection area on the basis of a phase difference between two images corresponding to the focus detection area, the focus detection apparatus comprising:

an image sensor comprising a plurality of pixels for focus detection configured to receive a pair of respective light beams transmitted through different pupil areas of a photographing lens, wherein a pair of image signals are output from the plurality of pixels for focus detection; and a selection unit configured to select one focus detection area from a plurality of focus detection areas set in advance, wherein the plurality of focus detection areas have different tilts, depending on image heights of respective focus detection areas; and a detection unit configured to detect the defocus amount on the basis of a phase difference between the pair of signals obtained from pixels for focus detection corresponding to the selected focus detection area.

7. The focus detection apparatus according to claim 6, wherein the tilt is obtained by the following expression:

$$\tan \theta = \{(ya-yb)/(xa-xb)\}$$

where $\theta$ represents a tilt, the coordinates (xa, ya) represent coordinates of a barycentric position in the pixels for focus detection which receive one of the light beams transmitted through the different pupil areas, and the coordinates (xb, yb) represent the coordinates of the barycentric position in the pixels for focus detection which receive the other light beam.

8. The focus detection apparatus according to claim 6, wherein the respective pixels for focus detection have a pair of light receiving areas to receive a pair of respective light beams transmitted through different pupil areas of the photographing lens.

9. The focus detection apparatus according to claim 6,
wherein the focus detection area has a configuration in which a plurality of pixel blocks with the pixels for focus detection vertically arranged are arranged in the direction of the tilt, and
wherein the detection unit detects the defocus amount on the basis of a phase difference between a pair of signals obtained for each of the pixel blocks by adding signals obtained on the basis of light beams transmitted through a same pupil area.

10. A control method for a focus detection unit for setting a focus detection area corresponding to a selected focus state detecting position, and detecting a defocus amount in the focus detection area on the basis of a phase difference between two images corresponding to the focus detection area, the control method comprising:

reading out a pair of image signals, from an image sensor comprising a plurality of pixels for focus detection for receiving a pair of respective light beams transmitted through different pupil areas of a photographing lens, wherein the pair of image signals are output from the plurality of pixels for focus detection;

determining a tilt of the focus detection area, depending on positional information on the focus state detecting position with respect to an angle of image sensing view and exit window information on the photographing lens; and detecting the defocus amount on the basis of a phase difference between a pair of images obtained from pixels for focus detection corresponding to the focus detection area with a determined tilt, from among the plurality of pixels for focus detection.

11. A control method for a focus detection unit for setting a focus detection area corresponding to a selected focus state detecting position, and detecting a defocus amount in the focus detection area on the basis of a phase difference between two images corresponding to the focus detection area, the control method comprising:

reading out a pair of image signals, from an image sensor comprising a plurality of pixels for focus detection for receiving a pair of respective light beams transmitted through different pupil areas of a photographing lens, wherein the pair of image signals are output from the plurality of pixels for focus detection; and selecting one focus detection area from a plurality of focus detection areas set in advance, wherein the plurality of focus detection areas have different tilts, depending on image heights of each focus detection area; and detecting the defocus amount on the basis of a phase difference between the pair of images obtained from pixels for focus detection included in the selected focus detection area.

12. A focus detection apparatus for detecting a defocus amount for use in focusing, on the basis of a pair of signals with a phase difference, obtained from a detection area comprising a plurality of pixels for detecting a defocus amount, the focus detection apparatus comprising:
- an image sensor comprising pixels for focus detection configured to receive a pair of respective light beams transmitted through different pupil areas of a photographing lens to output a pair of signals;
- a determination unit configured to determine the detection area, in response to a direction of image deviation of a pair of images from the pair of light beams; and
- a detection unit configured to detect the defocus amount on the basis of a phase difference between the pair of signals obtained from pixels for focus detection included in the detection area determined by the determination unit,
- wherein the focus detection area has a configuration in which a plurality of pixel blocks with the pixels for focus detection vertically arranged are arranged in the direction of the tilt, and
- wherein the detection unit detects the defocus amount on the basis of a phase difference between a pair of signals obtained for each of the pixel blocks by adding signals obtained on the basis of light beams transmitted through a same pupil area.

13. The focus detection apparatus according to claim 12, wherein the tilt is obtained by the following expression:

$$\tan \theta = \{(ya-yb)/(xa-xb)\}$$

where $\theta$ represents a tilt, the coordinates (xa, ya) represent coordinates of a barycentric position in the pixels for focus detection which receive one of the light beams transmitted through the different pupil areas, and the coordinates (xb, yb) represent the coordinates of the barycentric position in the pixels for focus detection which receive the other light beam.

* * * * *